US008120081B2

(12) United States Patent
Murakoshi

(10) Patent No.: US 8,120,081 B2
(45) Date of Patent: Feb. 21, 2012

(54) SOLID-STATE IMAGING DEVICE AND METHOD FOR MANUFACTURING SAME

(75) Inventor: Atsushi Murakoshi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 12/557,014

(22) Filed: Sep. 10, 2009

(65) Prior Publication Data
US 2010/0237451 A1   Sep. 23, 2010

(30) Foreign Application Priority Data
Mar. 23, 2009   (JP) .................................. 2009-071038

(51) Int. Cl.
H01L 31/0328 (2006.01)
(52) U.S. Cl. .................... 257/294; 257/228; 257/233
(58) Field of Classification Search .................. 257/228, 257/233, 294
See application file for complete search history.

(56) References Cited

U.S. PATENT DOCUMENTS

| 7,592,644 | B2* | 9/2009 | Suzuki et al. | 257/184 |
|---|---|---|---|---|
| 7,884,436 | B2* | 2/2011 | Mabuchi | 257/432 |
| 7,902,618 | B2* | 3/2011 | Mao et al. | 257/431 |
| 2006/0281215 | A1* | 12/2006 | Maruyama et al. | 438/57 |
| 2008/0083939 | A1* | 4/2008 | Guidash | 257/292 |
| 2010/0297805 | A1* | 11/2010 | Mabuchi | 438/73 |

FOREIGN PATENT DOCUMENTS

| JP | 2003-31785 | 1/2003 |
|---|---|---|
| JP | 2006-80457 | 3/2006 |
| JP | 2008-218968 | 9/2008 |

* cited by examiner

Primary Examiner — Eugene Lee
(74) Attorney, Agent, or Firm — Oblon, Spivak, McClelland, Maier & Neustadt, L.L.P.

(57) ABSTRACT

In a back-illuminated solid-state imaging device, a multilayer interconnect layer, a semiconductor substrate, a plurality of color filters, and a plurality of microlenses are provided in this order. A p-type region is formed so as to partition a lower portion of the semiconductor substrate into a plurality of regions, and an insulating member illustratively made of BSG is buried immediately above the p-type region. PD regions are isolated from each other by the p-type region and the insulating member. Moreover, a high-concentration region is formed in a lower portion of the PD region, and an upper portion is served as a low-concentration region.

8 Claims, 38 Drawing Sheets

SOLID-STATE IMAGING DEVICE AND METHOD FOR MANUFACTURING SAME

CROSS-REFERENCE TO RELATED APPLICATIONS

This application is based upon and claims the benefit of priority from the prior Japanese Patent Application No. 2009-71038, filed on Mar. 23, 2009; the entire contents of which are incorporated herein by reference.

BACKGROUND OF THE INVENTION

1. Field of the Invention

This invention relates to a back-illuminated solid-state imaging device and a method for manufacturing the same.

2. Background Art

Front-illuminated solid-state imaging devices have been conventionally developed. In a front-illuminated solid-state imaging device, a multilayer interconnect layer is provided on the frontside of a semiconductor substrate, and color filters and microlenses are provided on the multilayer interconnect layer. Furthermore, photodiodes are formed in the surface portion of the semiconductor substrate, and transfer gates are formed in the multilayer interconnect layer. For instance, the photodiode is formed from an n-type diffusion region, and partitioned for each pixel by p-type isolation layers. Light incident on the semiconductor substrate through the microlens, the color filter, and the multilayer interconnect layer from above is photoelectrically converted by the photodiode to generate electrons, which are read through the transfer gate.

In such a front-illuminated solid-state imaging device, externally applied light is incident on the semiconductor substrate through the multilayer interconnect layer, hence resulting in low light use efficiency. Thus, reduction in pixel size decreases the amount of light incident on the photodiode of each pixel, causing the problem of decreased sensitivity. Furthermore, reduction in pixel size also decreases the distance between pixels. Hence, light incident on a pixel may be diffused by the metal interconnect in the multilayer interconnect layer and incident on another pixel, causing the problem of color mixture. Color mixture decreases color resolution and prevents distinction of subtle color difference.

To solve these problems, a back-illuminated solid-state imaging device is proposed, which allows light to be incident on the backside of the semiconductor substrate, or on the side where no multilayer interconnect layer is provided (see, e.g., JP-A-2003-031785 (Kokai)). In a back-illuminated solid-state imaging device, externally applied light is incident on the semiconductor substrate without the intermediary of the multilayer interconnect layer, hence achieving high light use efficiency and high sensitivity.

However, in the back-illuminated solid-state imaging device, because light is directly incident on the semiconductor substrate without passing through the multilayer interconnect layer, obliquely incident light also reaches the semiconductor substrate without being blocked by the metal interconnect. This increases the amount of light incident on the isolation layer for isolating between photodiodes. Incidence of light on the isolation layer causes photoelectric conversion in the isolation layer and generates electrons, which flow into the photodiode adjacent to the isolation layer. Consequently, for instance, light incident on a red pixel may be incident on the isolation layer located between the red pixel and a blue pixel, and electrons generated by photoelectric conversion in this isolation layer may flow into the photodiode of the blue pixel and be detected as blue light. This causes color mixture. Reduction in pixel size increases the area ratio of the isolation layer to the photodiode, hence aggravating color mixture.

SUMMARY OF THE INVENTION

According to an aspect of the invention, there is provided a solid-state imaging device including: an interconnect structure; and a semiconductor substrate provided on the interconnect structure, the semiconductor substrate including: a first-conductivity-type region formed so as to partition a lower portion of the semiconductor substrate into a plurality of regions; and an insulating member made of an insulating material and buried in a region immediately above the first-conductivity-type region, the semiconductor substrate being irradiated with light from its upper surface side.

According to another aspect of the invention, there is provided a method for manufacturing a solid-state imaging device irradiated with light from above, including: forming trenches in an upper surface of a semiconductor substrate of a first conductivity type so as to partition an upper portion of the semiconductor substrate into a plurality of regions; forming an insulating member by burying an insulating material inside the trench; forming a first-conductivity-type region in the semiconductor substrate immediately below the insulating member by implanting a first-conductivity-type impurity from a lower surface side of the semiconductor substrate; and forming an interconnect structure on the lower surface of the semiconductor substrate.

DETAILED DESCRIPTION OF THE INVENTION

Embodiments of the invention will now be described with reference to the drawings.

At the outset, a first embodiment of the invention is described.

Figure 1:
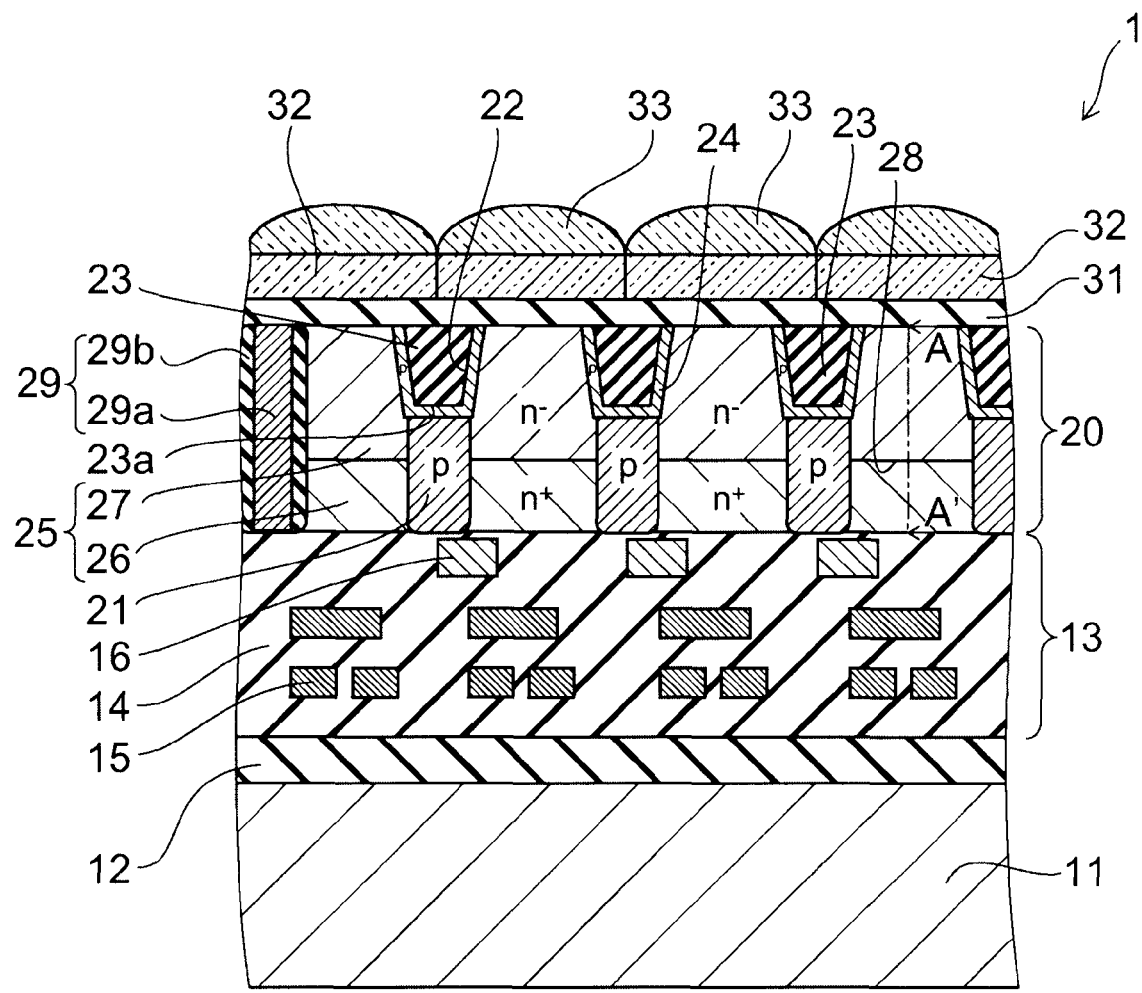
FIG. 1 is a cross-sectional view illustrating a solid-state imaging device according to a first embodiment of the invention.

FIG. 1 is a cross-sectional view illustrating a solid-state imaging device according to this embodiment.

Figure 2:
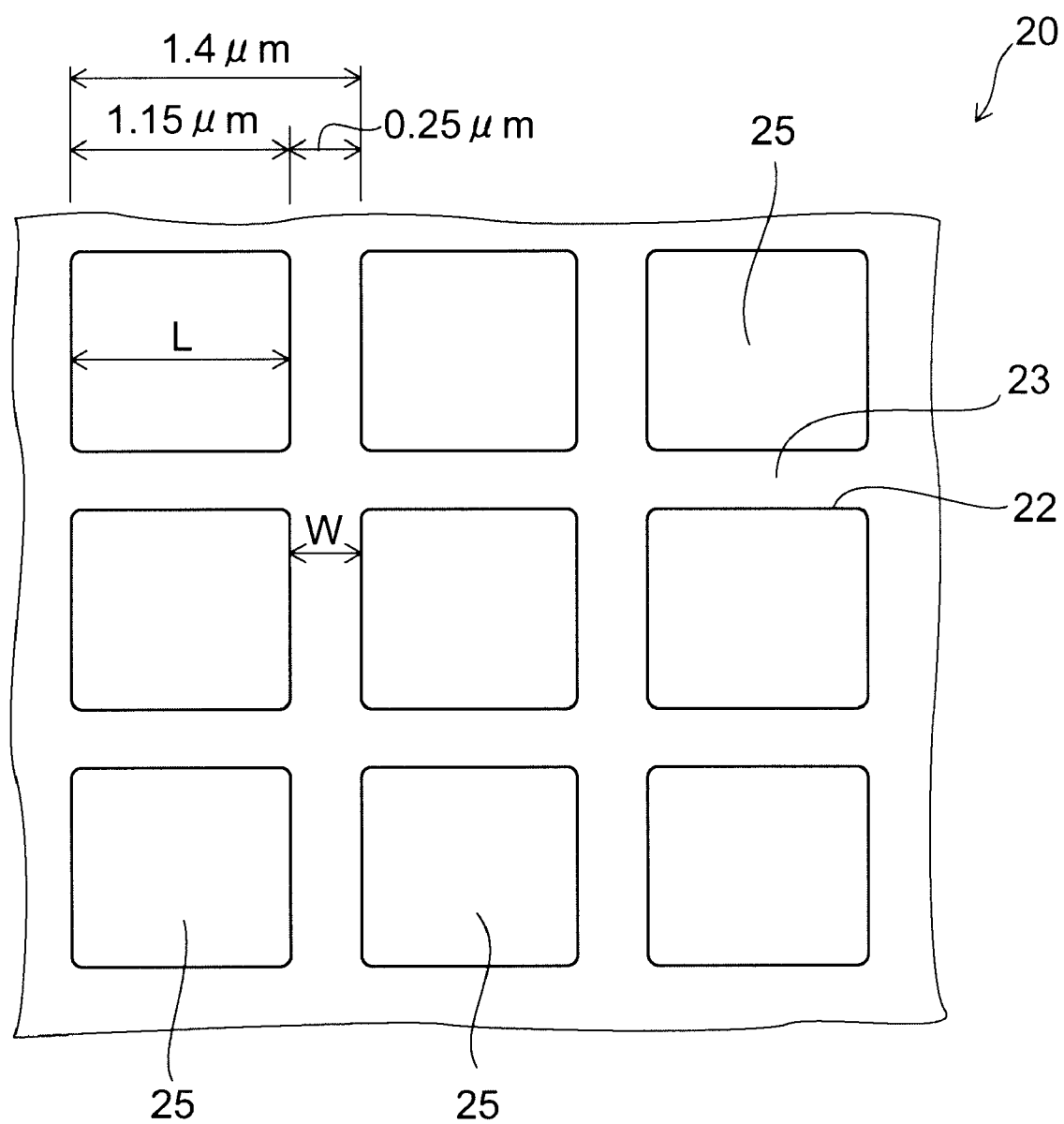
FIG. 2 is a plan view illustrating the solid-state imaging device according to the first embodiment.

FIG. 2 is a plan view illustrating the solid-state imaging device according to this embodiment.

Figure 3:
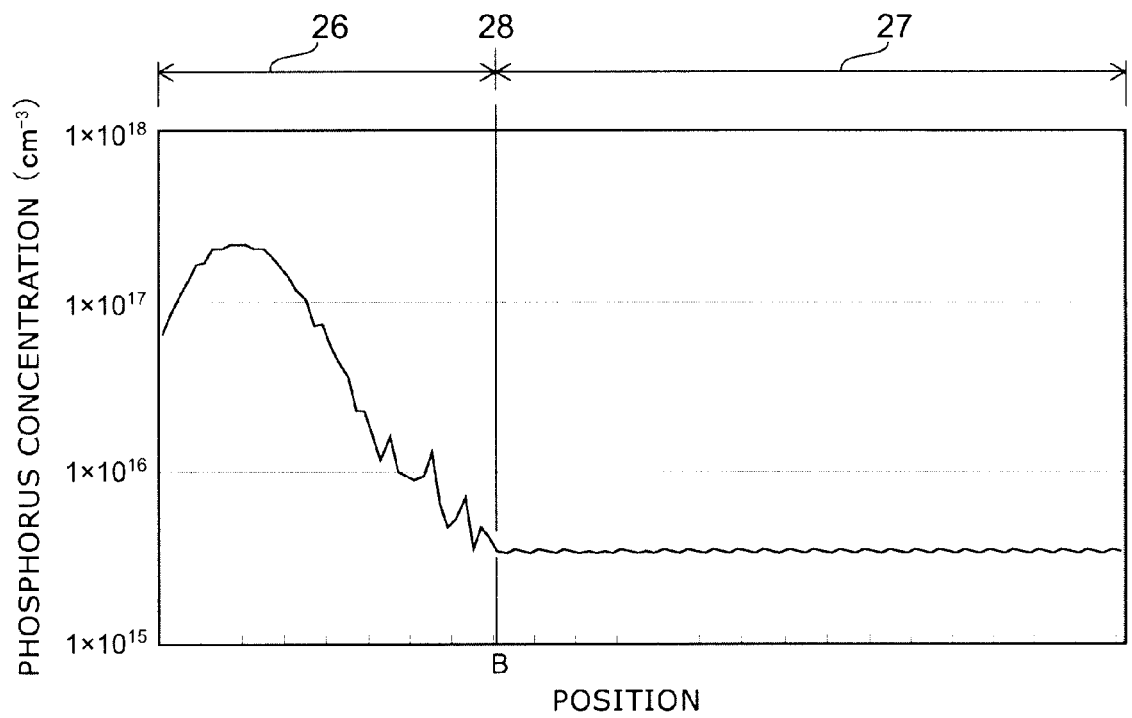
FIG. 3 is a graph illustrating the phosphorus concentration profile in a semiconductor substrate.

FIG. 3 is a graph illustrating the phosphorus concentration profile in the semiconductor substrate, where the horizontal axis represents position on line A-A' shown in FIG. 1, and the vertical axis represents phosphorus concentration.

Figure 4:
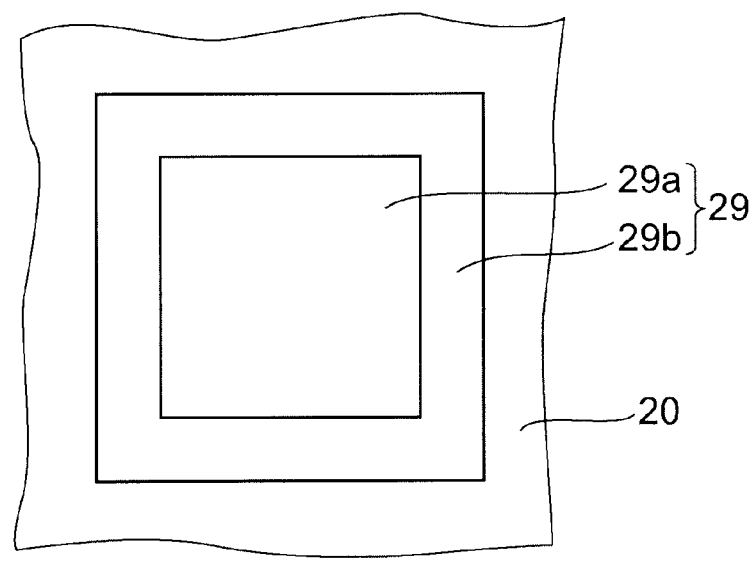
FIG. 4 is a plan view illustrating the marker of the solid-state imaging device according to the first embodiment.

FIG. 4 is a plan view illustrating the marker of the solid-state imaging device according to this embodiment.

As shown in FIG. 1, the solid-state imaging device 1 according to this embodiment includes a support substrate 11. The support substrate 11 serves to ensure the overall strength and rigidity of the solid-state imaging device 1, and is illustratively formed from silicon. On the support substrate 11 is provided a passivation film 12, and a multilayer interconnect layer 13 as an interconnect structure is provided thereon. In the multilayer interconnect layer 13, multiple layers of metal interconnects 15 are provided in an interlayer insulating film 14 illustratively made of an insulating material, such as silicon oxide. Transfer gates 16 are provided in the uppermost layer of the multilayer interconnect layer 13.

A semiconductor substrate 20 is provided on the multilayer interconnect layer 13. The semiconductor substrate 20 is illustratively formed from silicon. In a lower portion of the semiconductor substrate 20, p-type regions 21 are selectively provided. The p-type regions 21 are formed so as to partition the lower portion of the semiconductor substrate 20 into a plurality of regions. The p-type region 21 is doped with acceptor impurities, such as boron (B), and has p-type conductivity.

Immediately above the p-type region 21 in the semiconductor substrate 20, a trench 22 is formed from the upper surface side of the semiconductor substrate 20, and an insulating member 23 is buried in the trench 22. The insulating member 23 is illustratively formed from an insulating material, such as BSG (boron doped silicon glass, or boron doped silicon oxide). BSG has a lower transmittance to visible light than silicon. Furthermore, BSG has a lower refractive index than silicon. The refractive index of BSG, although depending on boron concentration, is generally 1.48-2.0, whereas the refractive index of silicon is approximately 4.2. Furthermore, a p-type region 24 is formed in the region of the semiconductor substrate 20 in contact with the insulating member 23 so as to enclose the insulating member 23.

In this specification, the direction from the multilayer interconnect layer 13 to the semiconductor substrate 20 is referred to as "above" or "upward", the direction from the semiconductor substrate 20 to the multilayer interconnect layer 13 is referred to as "below" or "downward", and the direction orthogonal to the upward and downward direction is referred to as "lateral". These expressions are independent of the direction of gravity. Light incident on the solid-state imaging device 1 comes from above and travels downward.

As shown in FIG. 2, as viewed from above, or in the direction perpendicular to the upper surface of the semiconductor substrate 20, the insulating member 23 is shaped like a lattice. Because the p-type region 21 (see FIG. 1) is formed immediately below the insulating member 23, the p-type region 21 is also shaped like a lattice as viewed from above. Thus, the semiconductor substrate 20 is partitioned into a plurality of PD (photodiode) regions 25 arranged in a matrix by the p-type region 21 and the insulating member 23. Each PD region 25 corresponds to one of the pixels of the solid-state imaging device 1. The PD regions 25 are electrically isolated from each other by the p-type region 21 and the insulating member 23. As viewed from above, each PD region 25 illustratively has a generally square shape.

A high-concentration region 26 having $n^+$-type conductivity is formed in a lower portion of the PD region 25. A low-concentration region 27 having $n^-$-type conductivity is formed immediately above the high-concentration region 26. Thus, the PD region 25 partitioned by the p-type region 21 and the insulating member 23 is composed of the high-concentration region 26 and the low-concentration region 27. The high-concentration region 26 and the low-concentration region 27 are doped with donor impurities, such as phosphorus (P). The lower surface 23a of the insulating member 23 is located above the interface 28 between the high-concentration region 26 and the low-concentration region 27.

As shown in FIG. 3, the vertical phosphorus concentration profile in the low-concentration region 27 is nearly uniform. This directly reflects the concentration of phosphorus originally contained in the semiconductor substrate 20. In contrast, the vertical phosphorus concentration profile in the high-concentration region 26 is higher than the phosphorus concentration in the low-concentration region 27, and forms one peak as a whole. This is because the high-concentration region 26 is formed by ion implantation of phosphorus into the semiconductor substrate 20. Hence, the effective impurity concentration in the low-concentration region 27 is lower than the effective impurity concentration in the high-concentration region 26. Here, the "effective impurity concentration" refers to the concentration of impurities contributing to electrical conduction, where those canceled between donors (n-type impurities) and acceptors (p-type impurities) are excluded from the total impurities.

In the phosphorus concentration profile shown in FIG. 3, as one moves from the upper end, or the position corresponding to the upper surface of the low-concentration region 27, to the lower end, or the position corresponding to the lower surface of the high-concentration region 26, the position B at which the peak starts corresponds to the interface 28. In the example shown in FIG. 3, the peak has only one maximal value. However, if the ion implantation is performed a plurality of times with different acceleration voltages, the peak may have a plurality of maximal values.

Furthermore, as shown in FIGS. 1 and 4, a marker 29 is buried in the semiconductor substrate 20. The marker 29 is used for alignment during such steps as lithography and inspection in the process for manufacturing the solid-state imaging device 1. The marker 29 is shaped like a quadrangular prism and penetrates through the semiconductor substrate 20. The marker 29 is composed of a core 29a of polysilicon coated therearound with a coating layer 29b of silicon oxide.

In addition to the aforementioned components, a reading circuit (not shown) and the like including such elements as amplifiers and reset transistors are formed in the multilayer interconnect layer 13 and the semiconductor substrate 20. These elements are formed in the lower surface of the semiconductor substrate 20, or in the surface on the multilayer interconnect layer 13 side. Hence, in the semiconductor substrate 20, if the lower surface including the elements is regarded as the frontside, the upper surface irradiated with light can be regarded as the backside.

An antireflective film 31 illustratively made of silicon oxide or silicon nitride is provided on the semiconductor substrate 20. A plurality of color filters 32 are provided on the antireflective film 31. The color filter 32 is provided for each pixel, or for each PD region 25, immediately above each PD region 25, for instance. The color filters 32 are illustratively a red filter for transmitting red light and blocking light of the other colors, a green filter for transmitting green light and blocking light of the other colors, and a blue filter for transmitting blue light and blocking light of the other colors. A planoconvex microlens 33 is provided on each color filter 32.

Thus, each pixel of the solid-state imaging device 1 is provided with one microlens 33, one color filter 32, one low-concentration region 27, and one high-concentration region 26 sequentially from above. The aforementioned transfer gate 16 is also provided for each pixel.

In the following, example dimensions of the components of the solid-state imaging device 1 are illustrated.

The thickness of the semiconductor substrate 20 is reduced to 3.5 µm by grinding. The trench 22 has a width W of 0.25 µm and a depth of 0.5 µm. Hence, the trench 22 has an aspect ratio of 2. Thus, the insulating member 23 also has an aspect ratio of approximately 2. That is, the height of the insulating member 23 is approximately twice the minimum lateral length of the insulating member 23. Here, to ensure good burying characteristics, the aspect ratio of the trench 22 and the insulating member 23 is preferably 6 or less, and more preferably 4 or less.

The p-type region 21 is formed by ion implantation from the lower surface side of the semiconductor substrate 20 using a mask having an opening width of 0.25 µm at a maximum acceleration energy of 2 MeV, and extends to a depth of 3 µm from the lower surface of the semiconductor substrate 20. On the other hand, the p-type region 24 has a thickness of 0.1 µm. The p-type region 21 is in contact with the p-type region 24. Furthermore, as viewed from above, the length L of one side of the PD region 25 is 1.15 µm. Because the trench 22 has a width W of 0.25 µm as described above, one pixel is shaped like a square, 1.4 µm on a side.

Next, the operation of the solid-state imaging device according to this embodiment is described.

The solid-state imaging device 1 is placed to allow external light to be applied from above. The external light applied from above is collected by the microlens 33, wavelength-selected by the color filter 32, transmitted through the antireflective film 31, and incident on the semiconductor substrate 20. Here, the light incident on the PD region 25 is primarily passed through the low-concentration region 27 and photoelectrically converted in the high-concentration region 26, but photoelectrically converted also in the low-concentration region 27. That is, the PD region 25 functions as a photodiode of each pixel. Electrons generated by this photoelectric conversion are stored in the PD region 25 and transferred by the transfer gate 16 to the reading circuit, where they are read.

On the other hand, part of the external light transmitted through the antireflective film 31 is incident on the insulating member 23. Here, the insulating member 23 is formed from BSG, which is an insulating material. Hence, no photoelectric conversion occurs in the insulating member 23. Thus, no electron is generated in the insulating member 23, and there is also no leakage of generated electrons into the PD region 25 of the adjacent pixel. Hence, there is also no color mixture due to such leakage.

Furthermore, the material constituting the insulating member 23, or BSG, has a lower transmittance to visible light than the material constituting the low-concentration region 27, or silicon. Hence, light injected into the insulating member 23 is rapidly attenuated. Thus, most of the light injected into the insulating member 23 is absorbed in the insulating member 23, and does not reach the p-type region 21. This can prevent photoelectric conversion in the p-type region 21 and color mixture resulting from such photoelectric conversion.

Furthermore, BSG constituting the insulating member 23 has a lower refractive index than silicon constituting the low-concentration region 27. Hence, the light once injected into the low-concentration region 27 and reaching the side surface of the insulating member 23 through the low-concentration region 27 is partly reflected back into the insulating member 23 at the interface between the low-concentration region 27 and the insulating member 23. Furthermore, the light injected into the insulating member 23 through the side surface of the insulating member 23 is also refracted at the interface between the low-concentration region 27 and the insulating member 23, and its traveling direction changes to a downward direction. Thus, most of the light injected into the insulating member 23 is absorbed in the insulating member 23, and its leakage into the pixel on the opposite side can be prevented. This also serves to prevent color mixture.

The material of the insulating member 23 is not limited to BSG, but needs to be an insulating material to avoid photoelectric conversion. Here, the condition of avoiding photoelectric conversion could also be satisfied by burying a metal in the trench 22. However, this makes it impossible to perform high-temperature heat treatment after burying the metal and significantly constrains the process for manufacturing the solid-state imaging device. Furthermore, preferably, the material of the insulating member 23 has a lower transmittance to visible light than the material of the low-concentration region 27. This allows the light injected into the insulating member 23 to be effectively absorbed. Furthermore, preferably, the material of the insulating member 23 has a lower refractive index than the material of the low-concentration region 27. This allows the light reaching the side surface of the insulating member 23 to be reflected or refracted downward.

In the case where the semiconductor substrate 20 is formed from silicon, materials suitable for the insulating member 23, that is, insulating materials which have lower transmittance and refractive index than silicon constituting the low-concentration region 27 and are compatible with the silicon process, include PSG (phosphorus doped silicon glass, or phosphorus doped silicon oxide) and BPSG (boron phosphorus doped silicon glass, or boron phosphorus doped silicon oxide) as well as BSG described above. The insulating member 23 can also be made of such materials as alumina ($Al_2O_3$) and silicon nitride ($Si_3N_4$). Alumina has the problem of aluminum being easily diffused by heat treatment, and silicon nitride has the problem of high thermal stress. However, they can be used if these problems can be avoided.

Next, the effect of this embodiment is described.

As described above, according to this embodiment, a pixel isolation region is formed by forming a trench 22 in the upper portion of the semiconductor substrate 20 and burying therein an insulating member 23. Hence, no photoelectric conversion occurs in the pixel isolation region. Furthermore, the insulating member 23 is formed from a material having low transmittance to visible light. This serves to effectively absorb light injected into the insulating member 23. Furthermore, the insulating member 23 is formed from a material having a lower refractive index than the semiconductor material constituting the semiconductor substrate 20. This serves to prevent light injected into the side surface of the insulating member 23 from being transmitted through the insulating member 23 and incident on the pixel on the opposite side. By the foregoing mechanism, color mixture can be prevented.

Furthermore, according to this embodiment, the insulating member 23 is buried in the upper portion of the semiconductor substrate 20. Hence, the p-type region 21 needs to be formed only in the lower portion of the semiconductor substrate 20. Thus, in the ion implantation for forming the p-type region 21, the acceleration voltage can be reduced. This can reduce lateral diffusion of injected impurities. Hence, the p-type region 21 can be thinly formed, and the width of the PD region 25 can be ensured accordingly. Consequently, the volume of the PD region 25 functioning as a photodiode can be ensured, and the sensitivity can be increased. In other words, decrease in sensitivity can be prevented despite reduction in pixel size.

Furthermore, according to this embodiment, the p-type region 24 is formed around the insulating member 23 so as to enclose the insulating member 23. Thus, electrons generated from an unpaired electron existing at the surface of the insulating member 23 can be absorbed by the p-type region 24. This can prevent noise resulting from unpaired electrons.

Furthermore, according to this embodiment, the lower surface 23a of the insulating member 23 is located above the interface 28 between the high-concentration region 26 and the low-concentration region 27. Thus, the insulating member 23 and the p-type region 24 are not placed around the high-concentration region 26 constituting the major portion of the photodiode, and decrease in the volume of the high-concentration region 26 due to the p-type region 24 can be prevented. Consequently, the number of saturated electrons is ensured, and the sensitivity of the photodiode can be increased. Thus, this embodiment can provide a solid-state imaging device having high sensitivity and being resistant to color mixture despite reduction in pixel size.

Next, the aforementioned effect of the insulating member is described by comparing examples of this embodiment with a comparative example.

First Example

At the outset, a first example of the first embodiment is described.

The solid-state imaging device according to this example has the same configuration as the above first embodiment. That is, an insulating member 23 made of BSG is buried in the upper portion of the semiconductor substrate 20. The dimensions of the components are as illustrated above.

Figure 5:
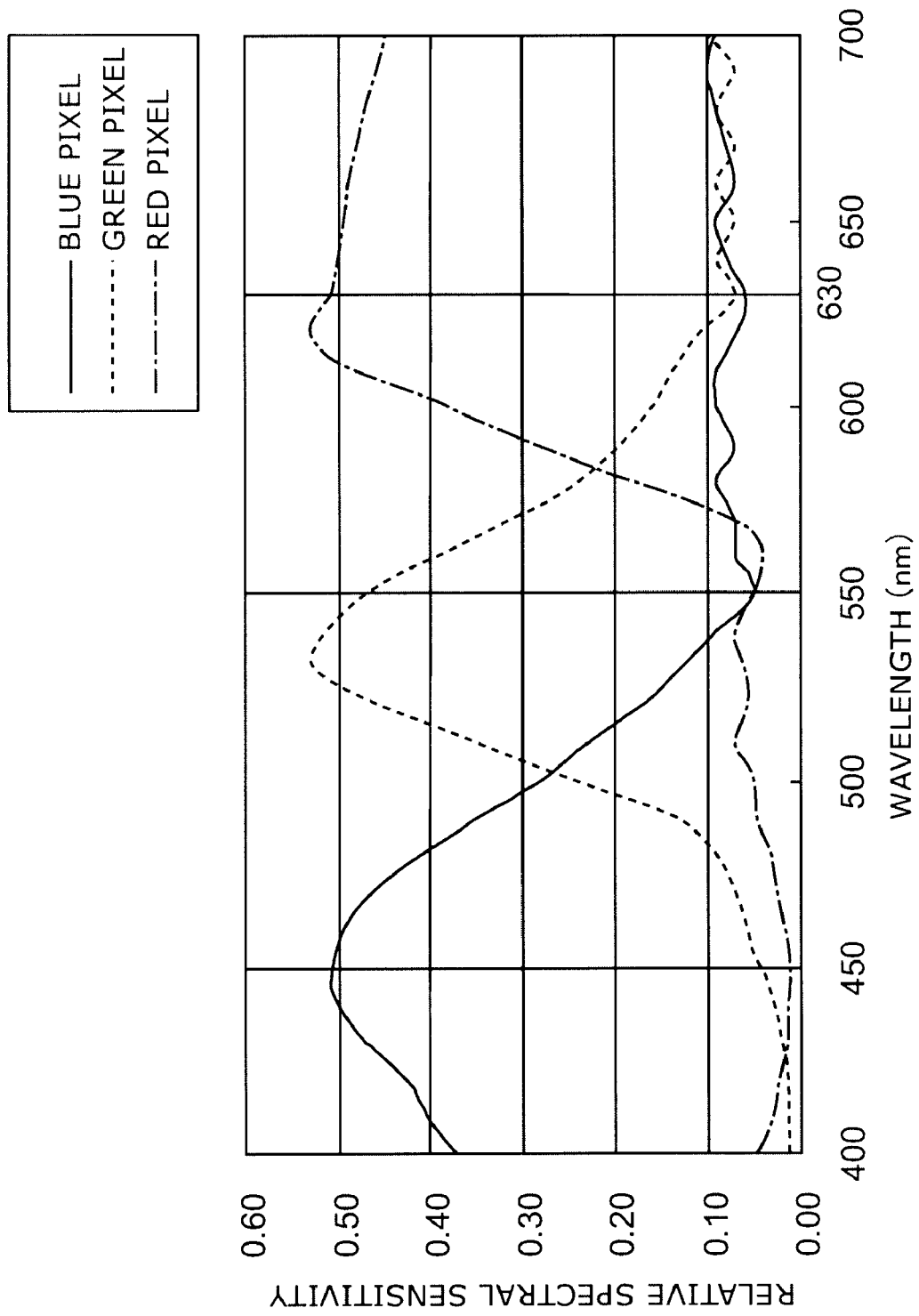
FIG. 5 is a graph illustrating the spectral characteristics of light detected by each color pixel of the solid-state imaging device according to a first example.

FIG. 5 is a graph illustrating the spectral characteristics of light detected by each color pixel of the solid-state imaging device according to the first example, where the horizontal axis represents light wavelength, and the vertical axis represents relative spectral sensitivity.

The curves shown in FIG. 5 represent the intensity of light detected by the respective color pixels with respect to wavelength. Ideally, light at a wavelength is sensed by one or two color pixels, and it is desired that the overlap of the three curves shown in FIG. 5 be smaller. In practice, light at a wavelength is sensed by all the three color pixels, and the three curves overlap each other throughout the visible light region. As this overlap becomes larger, the degree of color mixture becomes higher.

As shown in FIG. 5, in the solid-state imaging device according to this example, for light at a wavelength of 450 nm, which is the detection center of the blue pixel, the green pixel has a relative spectral sensitivity of approximately 5%, and the red pixel has a relative spectral sensitivity of approximately 1%. For light at a wavelength of 550 nm, which is the detection center of the green pixel, the blue pixel and the red pixel both have a relative spectral sensitivity of approximately 5%. Furthermore, for light at a wavelength of 630 nm, which is the detection center of the red pixel, the blue pixel has a relative spectral sensitivity of approximately 6%, and the green pixel has a relative spectral sensitivity of approximately 8%. The foregoing results are listed in TABLE 1 below.

Second Example

Next, a second example of the first embodiment is described.

Figure 6:
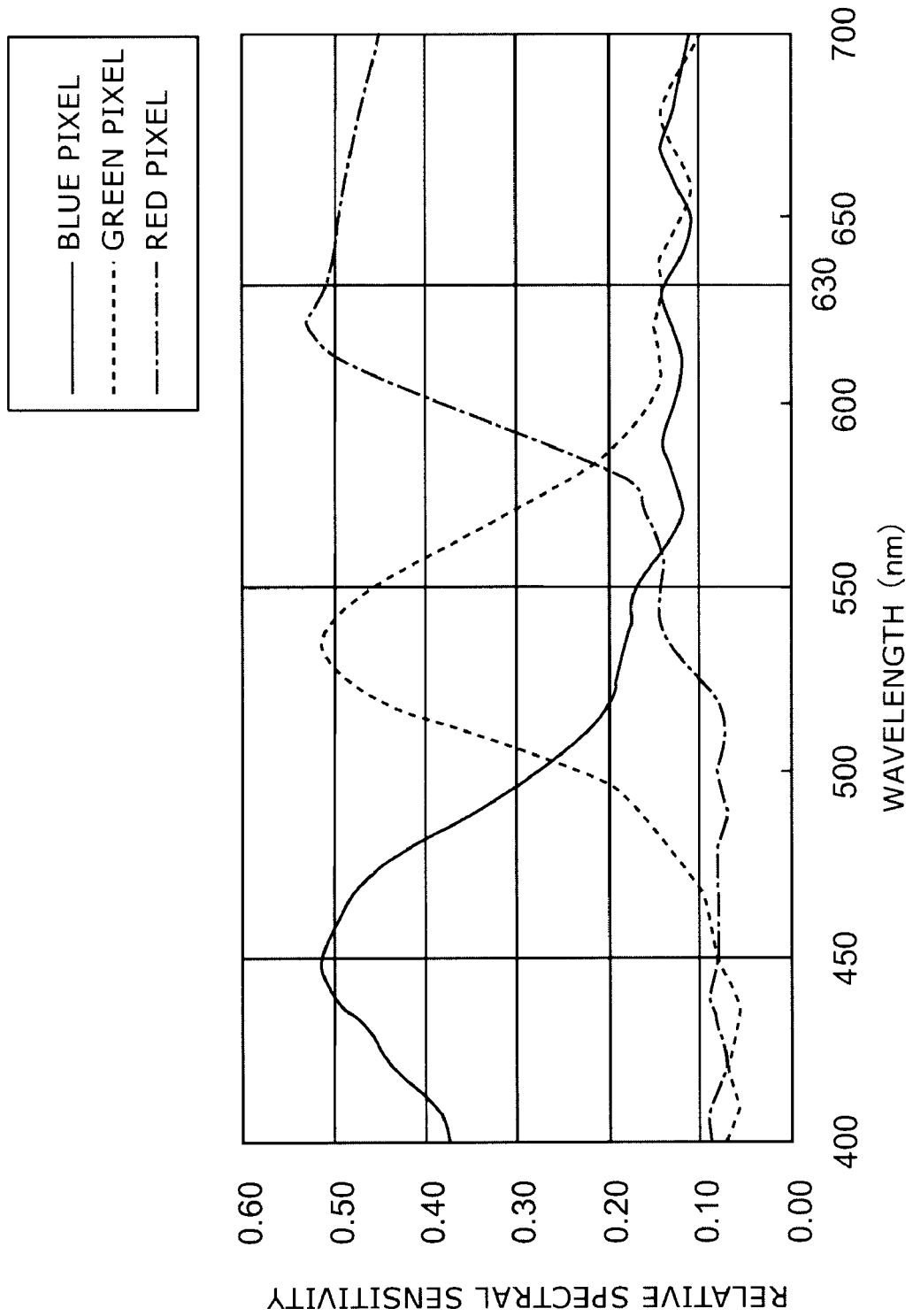
FIG. 6 is a graph illustrating the spectral characteristics of light detected by each color pixel of the solid-state imaging device according to a second example.

FIG. 6 is a graph illustrating the spectral characteristics of light detected by each color pixel of the solid-state imaging device according to the second example, where the horizontal axis represents light wavelength, and the vertical axis represents relative spectral sensitivity.

In this example, the insulating member 23 is formed by depositing silicon oxide ($SiO_2$) by the CVD (chemical vapor deposition) method using TEOS (tetraethyl orthosilicate) as a raw material. That is, in the solid-state imaging device according to this example, the insulating member 23 is formed from non-doped silicon oxide, which is not doped with boron or other impurities. Silicon oxide not doped with boron has a higher transmittance to visible light than BSG. Furthermore, the refractive index of silicon oxide (approximately 1.52) tends to be lower than the refractive index of BSG (approximately 1.48-2.0), and is lower than the refractive index of silicon (approximately 4.2). The configuration of this example other than the foregoing is the same as that of the above first example.

As shown in FIG. 6, in the solid-state imaging device according to this example, for light at a wavelength of 450 nm, which is the detection center of the blue pixel, the green pixel and the red pixel have a relative spectral sensitivity of approximately 8%. For light at a wavelength of 550 nm, which is the detection center of the green pixel, the blue pixel has a relative spectral intensity of approximately 17%, and the red pixel has a relative spectral sensitivity of approximately 14%. Furthermore, for light at a wavelength of 630 nm, which is the detection center of the red pixel, the blue pixel and the green pixel both have a relative spectral sensitivity of approximately 14%. The foregoing results are listed in TABLE 1 below.

Thus, in this example, as compared with the above first example, color mixture is increased particularly in the long-wavelength region. It is considered that this is attributable to the difference of materials constituting the insulating member 23. More specifically, of the light injected into the insulating member 23, light in the short-wavelength region, such as light at a wavelength of 450 nm, is mostly absorbed in the insulating member 23. However, silicon oxide constituting the insulating member 23 in this example has a higher transmittance than BSG. Hence, light in the long-wavelength region, such as light at a wavelength of 550 nm and 630 nm, is partly transmitted through the insulating member 23, incident on the p-type region 21, and photoelectrically converted in the p-type region 21. Then, electrons generated in the p-type region 21 leak into the PD region 25 of the adjacent pixel. It is considered that this increases color mixture in the long-wavelength region.

Comparative Example

Next, a comparative example of the first embodiment is described.

Figure 7:
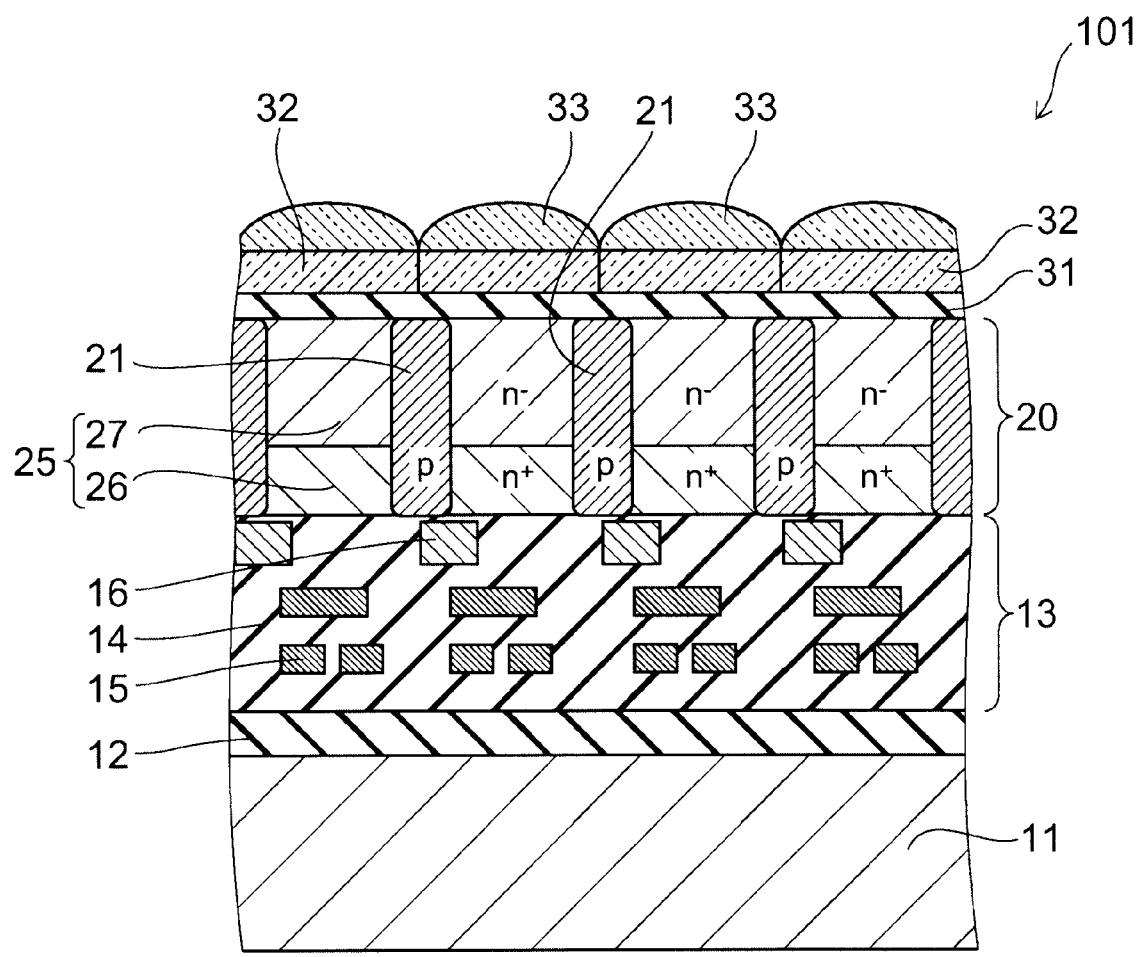
FIG. 7 is a cross-sectional view illustrating a solid-state imaging device according to a comparative example.

FIG. 7 is a cross-sectional view illustrating a solid-state imaging device according to this comparative example.

Figure 8:
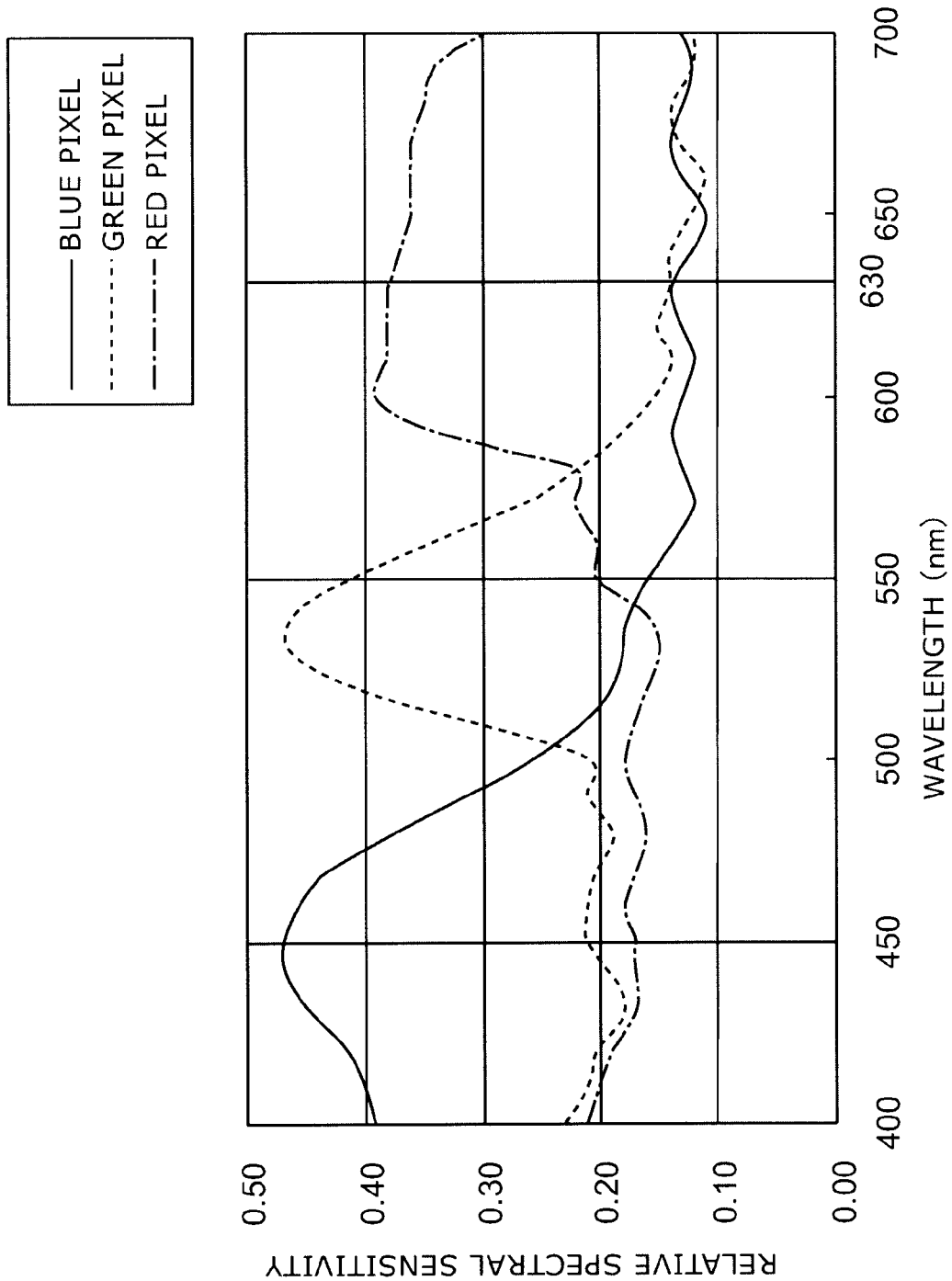
FIG. 8 is a graph illustrating the spectral characteristics of light detected by each color pixel of the solid-state imaging device according to this comparative example.

FIG. 8 is a graph illustrating the spectral characteristics of light detected by each color pixel of the solid-state imaging device according to this comparative example, where the horizontal axis represents light wavelength, and the vertical axis represents relative spectral sensitivity.

As shown in FIG. 7, in the solid-state imaging device 101 according to this comparative example, no trench 22 (see FIG. 1) is formed in the semiconductor substrate 20, and no insulating member 23 (see FIG. 1) is buried. Instead, in the solid-state imaging device 101, the p-type region 21 extends to the upper surface of the semiconductor substrate 20 and partitions the PD region 25 for each pixel. To realize this configuration, in this comparative example, the p-type region 21 is formed to a depth of 3.5 μm from the lower surface of the semiconductor substrate 20 by ion implantation of boron at a maximum acceleration energy of 3.2 MeV. The configuration of this comparative example other than the foregoing is the same as that of the above first example.

As shown in FIG. 8, in the solid-state imaging device 101 according to this comparative example, for light at a wavelength of 450 nm, which is the detection center of the blue pixel, the green pixel has a relative spectral sensitivity of approximately 21%, and the red pixel has a relative spectral sensitivity of approximately 17%. For light at a wavelength of 550 nm, which is the detection center of the green pixel, the blue pixel has a relative spectral sensitivity of approximately 16%, and the red pixel has a relative spectral intensity of approximately 20%. Furthermore, for light at a wavelength of 630 nm, which is the detection center of the red pixel, the blue pixel and the green pixel both have a relative spectral sensitivity of approximately 14%. The foregoing results are listed in TABLE 1 below.

As shown in FIGS. 5 and 8 and TABLE 1, in this comparative example, as compared with the above first example, color mixture is increased in the entire wavelength region. It is considered that this is because external light applied from above is incident on the p-type region 21, light in the entire wavelength region is photoelectrically converted in the p-type region 21, and the resulting electrons leak into the adjacent pixel. In contrast, according to the above first example, the p-type region 21 does not reach the upper surface of the semiconductor substrate 20, but the insulating member 23 is buried immediately above the p-type region 21. Hence, such color mixture can be prevented. Color mixture of light in the short-wavelength region can be prevented also in the second example.

TABLE 1

| | | Wavelength (nm) | | | | | |
|---|---|---|---|---|---|---|---|
| | | 450 | | 550 | | 630 | |
| | | Pixel | | | | | |
| | | Green | Red | Blue | Red | Blue | Green |
| Relative spectral intensity (%) | Ex. 1 | 5 | 1 | 5 | 5 | 6 | 8 |
| | Ex. 2 | 8 | 8 | 17 | 14 | 14 | 14 |
| | Comp. | 21 | 17 | 16 | 20 | 14 | 14 |

Number of Saturated Electrons

Next, the number of saturated electrons is compared between the first and second example (hereinafter collectively referred to as "example") and the comparative example described above. The sensitivity of a photodiode depends on the number of saturated electrons, and becomes higher as the number of saturated electrons becomes larger. The number of saturated electrons depends on the volume of the photodiode, and can be increased as the volume increases. In the structure of this embodiment, if a constant pixel size is assumed, the volume of the photodiode, or the volume of the PD region 25, depends on the width of the p-type region 21, and as the width of the p-type region 21 increases, the volume of the PD region 25 decreases by that amount. The width of the p-type region 21 depends on the acceleration energy in impurity implantation for forming the p-type region 21. As the acceleration energy becomes higher, the lateral range distance of impurities becomes longer, and the width of the p-type region 21 increases. Hence, reduction in the acceleration energy for forming the p-type region 21 serves to decrease the lateral range distance of impurities and narrow the width of the p-type region 21. By that amount, the volume of the PD region 25 can be increased, the number of saturated electrons can be increased, and the sensitivity can be enhanced.

Figure 9:
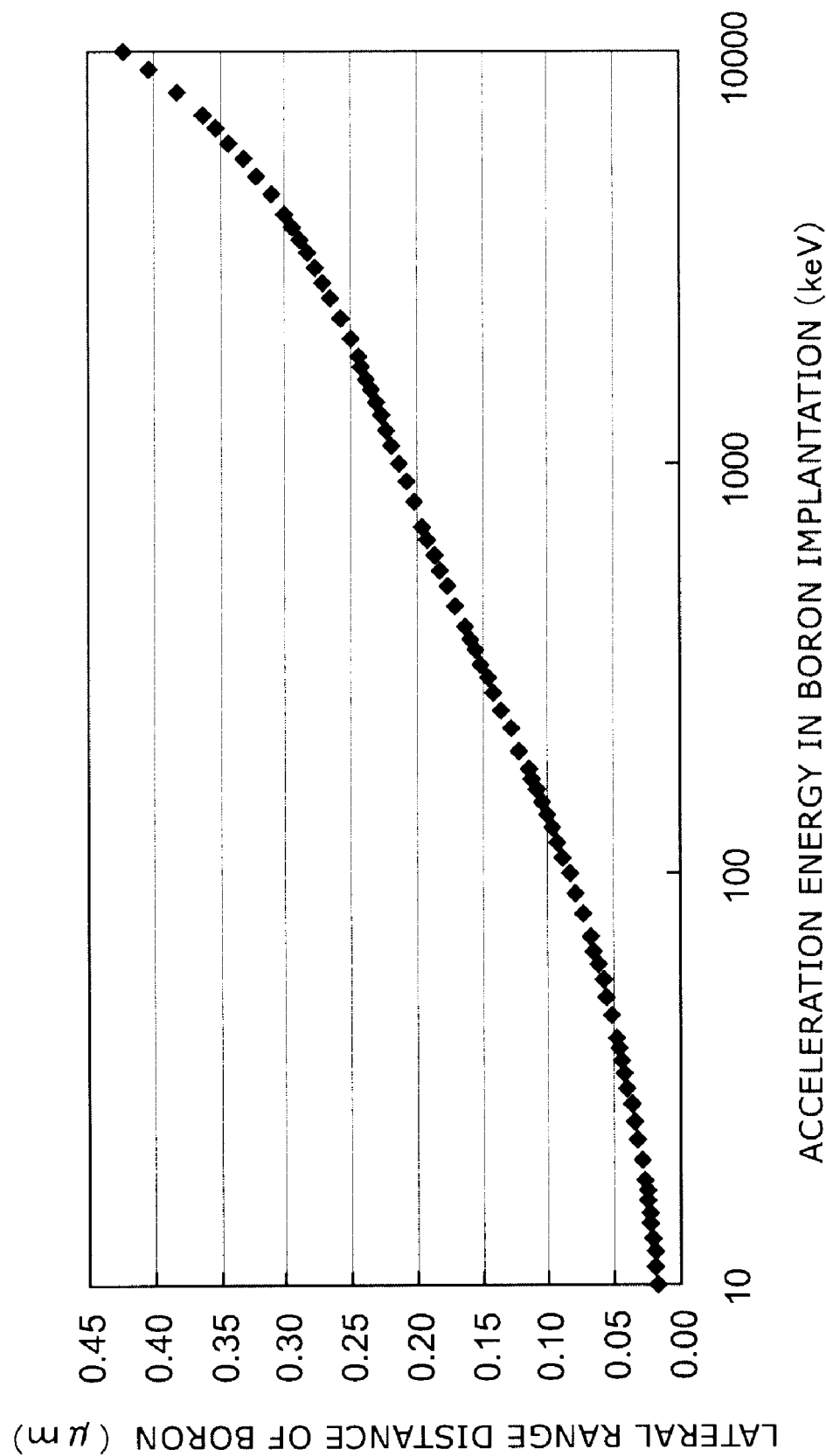
FIG. 9 is a graph illustrating the relationship between acceleration energy and lateral range distance.

FIG. 9 is a graph illustrating the relationship between acceleration energy and lateral range distance, where the horizontal axis represents acceleration energy in ion implantation of boron, and the vertical axis represents the lateral range distance of implanted boron.

In the above example, the p-type region 21 needs to be formed only immediately below the trench 22, and boron can be implanted not only from the lower surface of the semiconductor substrate 20 but also from the bottom surface of the trench 22. Hence, the acceleration energy in ion implantation of boron can be reduced. For instance, if the acceleration energy is 150 keV, then from FIG. 9, the lateral range distance is approximately 0.10 μm. On the other hand, in the above comparative example, the p-type region 21 is formed so as to penetrate through the semiconductor substrate 20. Hence, high acceleration energy is needed in boron implantation. For instance, if the acceleration energy is 3.2 MeV, then from FIG. 9, the lateral range distance is approximately 0.28 μm.

TABLE 2 lists the acceleration voltage of boron, the lateral range distance of boron, the width of the p-type region 21, the length of a side of the PD region 25 as viewed from above, the upper surface area of the PD region 25, and the number of saturated electrons for a solid-state imaging device under the assumption that the design values of the example is exactly realized, the solid-state imaging device according to the example, and the solid-state imaging device according to the comparative example.

As shown in FIG. 2, the upper surface of the PD region 25 is shaped like a square, and the design value of the length L of a side thereof is 1.15 μm. The design value of the width of the p-type region 21 is 0.25 μm, which is equal to the width W of the trench 22. However, in the example and the comparative example, the width of the p-type region 21 is a value obtained by adding twice the lateral range distance to the design value. Furthermore, the upper surface of the PD region 25 is eroded from around by the amount of the lateral range distance, and decreases its area. On the other hand, the values of the number of saturated electrons listed in TABLE 2 are measurement values.

TABLE 2

| | Acceleration voltage (keV) | Lateral range distance (μm) | Width of p-type region (μm) | Side length of PD region (μm) | Upper surface area of PD region (μm²) | Number of saturated electrons |
|---|---|---|---|---|---|---|
| Design value | — | 0 | 0.25 | 1.15 | 1.3225 | — |
| example | 150 | 0.10 | 0.45 | 0.95 | 0.9025 | 4700 |
| Comparative example | 3200 | 0.28 | 0.81 | 0.59 | 0.3481 | 3500 |

As listed in TABLE 2, in the example of this embodiment, the number of saturated electrons is larger than in the comparative example. It is considered that this is because, as listed in TABLE 2, reduction in the acceleration energy for impurity implantation in forming the p-type region 21 serves to prevent lateral expansion of the p-type region 21 and ensure the volume of the PD region 25. Thus, according to this example, the sensitivity of the photodiode can be increased.

Next, a second embodiment of the invention is described.

This embodiment relates to a method for manufacturing a solid-state imaging device.

FIGS. 10 to 54 are process cross-sectional views illustrating the method for manufacturing a solid-state imaging device according to this embodiment.

In the following description, like the above first embodiment, it is assumed that in the completed solid-state imaging device, the direction from which light comes is referred to as "above".

Figure 10:
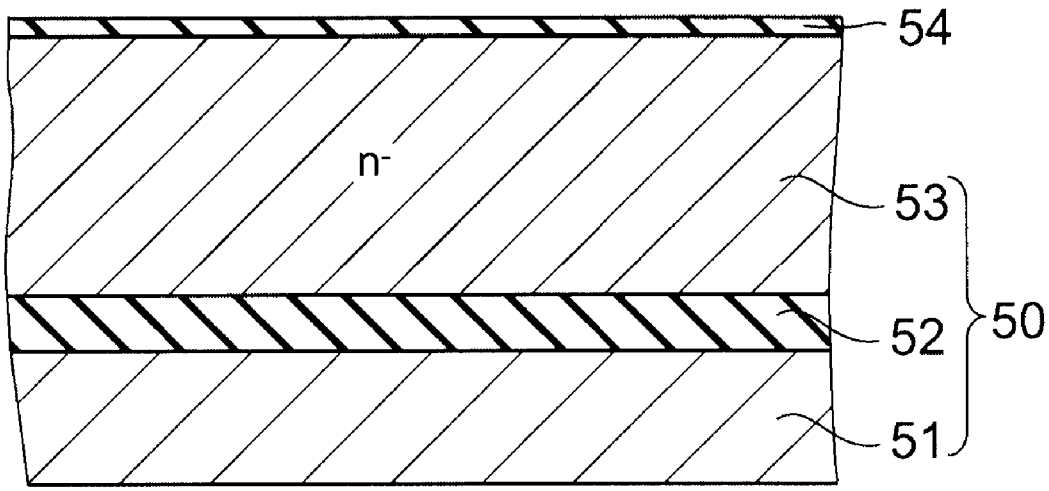
FIG. 10 is a process cross-sectional view illustrating a method for manufacturing the solid-state imaging device according to the second embodiment of the invention.

As shown in FIG. 10, an SOI (silicon on insulator) substrate 50 is prepared. The SOI substrate 50 includes a base member 51 made of silicon, and a BOX oxide film 52 made of silicon oxide is provided on the base member 51. The BOX oxide film 52 has a thickness of e.g. 135 nm. A silicon layer 53 made of silicon and having n⁻-type conductivity is provided on the BOX oxide film 52. The silicon layer 53 is illustratively formed by epitaxial growth and doped with donor impurities, such as phosphorus, at a concentration of $3.5 \times 10^{15}$-$1 \times 10^{16}$ cm$^{-3}$. The silicon layer 53 serves as a semiconductor substrate 20 (see FIG. 1) in the completed device.

First, a silicon oxide film (not shown) having a thickness of e.g. 2 nm is formed on the upper surface of the SOI substrate 50, or on the silicon layer 53, by the LP-CVD (low pressure chemical vapor deposition) method. Then, a silicon nitride film 54 having a thickness of e.g. 50 nm is formed.

Next, a marker 29 (see FIG. 18) is formed in the SOI substrate 50 by the following process.

Figure 11:
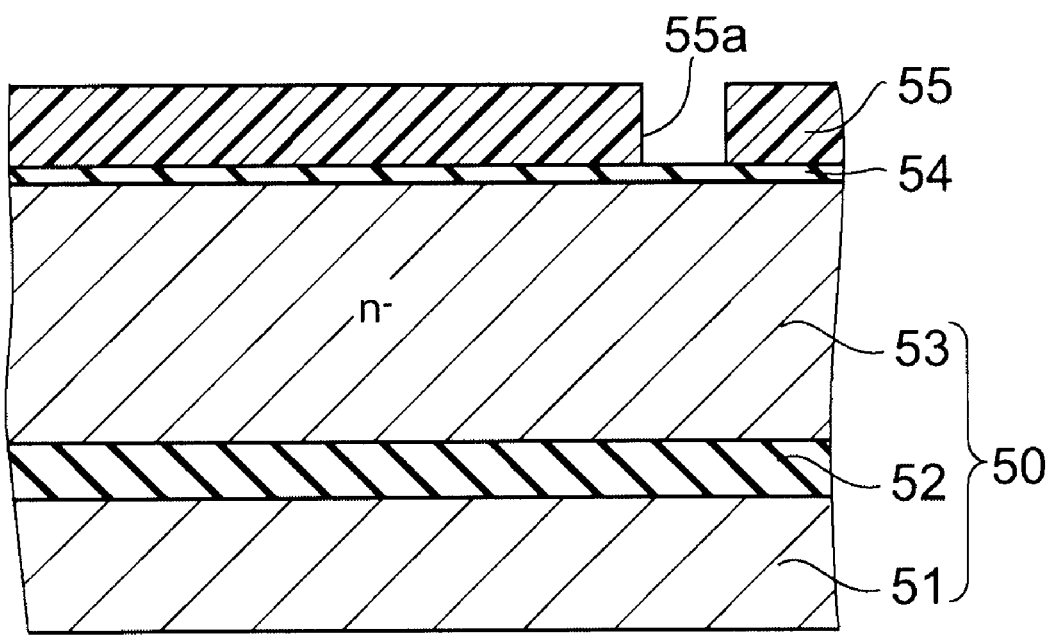
FIGS. 11 to 54 are process cross-sectional views illustrating the method for manufacturing the solid-state imaging device according to the second embodiment.

First, as shown in FIG. 11, a resist material is applied onto the silicon nitride film 54 to form a resist mask 55 having a thickness of e.g. 1.8 μm. Then, exposure and development are performed on a region intended for a marker 29 to form an opening 55a in this region. As viewed from above, the opening 55a is shaped like a square, and the length of a side thereof, or the opening width, is 2 μm.

Figure 12:
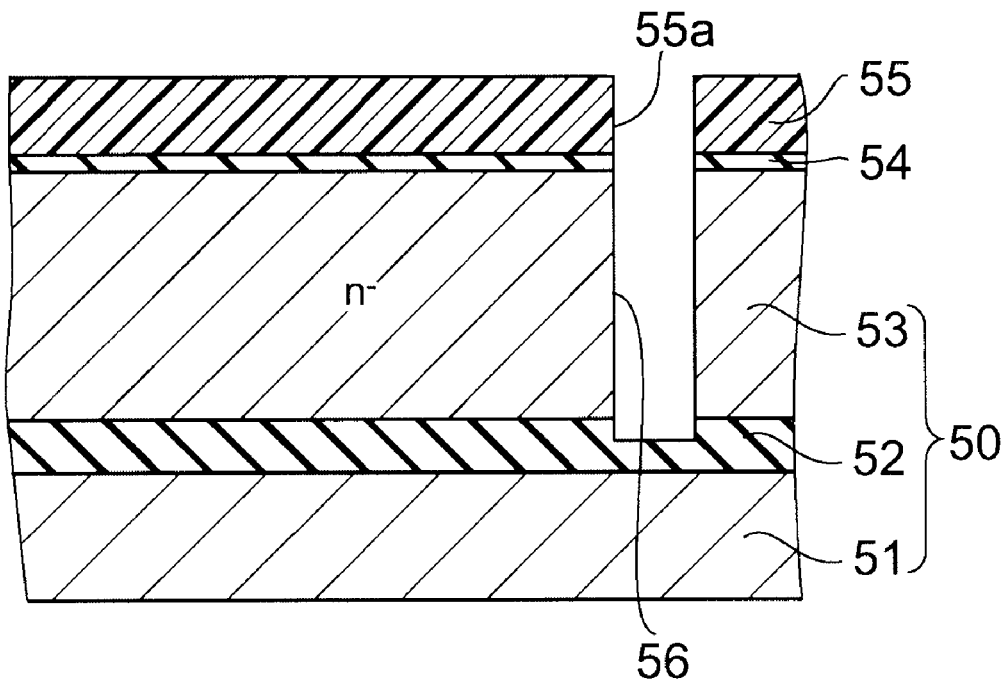

Next, as shown in FIG. 12, the resist mask 55 is used as a mask to perform dry etching. Thus, the silicon nitride film 54 and the silicon layer 53 immediately below the opening 55a are selectively removed. This dry etching is stopped upon reaching the BOX oxide film 52. Consequently, a deep trench 56 penetrating through the silicon nitride film 54 and the silicon layer 53 and reaching the BOX oxide film 52 is formed. Here, this dry etching is accompanied by residues (deposits). Furthermore, damage occurs on the inner surface of the deep trench 56.

Figure 13:
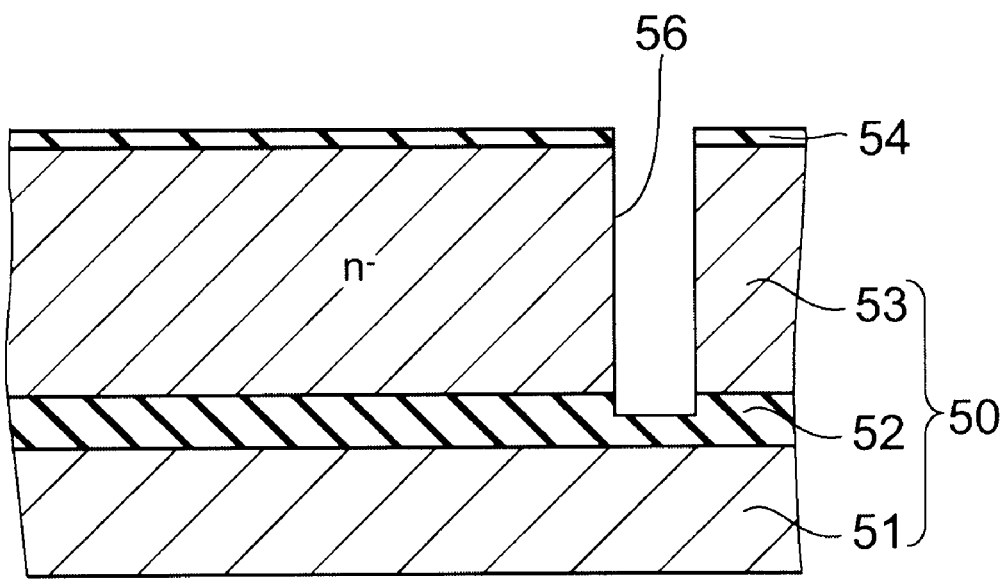

Next, as shown in FIG. 13, the resist mask 55 (see FIG. 12) is stripped. Subsequently, residues are removed by washing with a hydrofluoric acid-based chemical.

Figure 14:
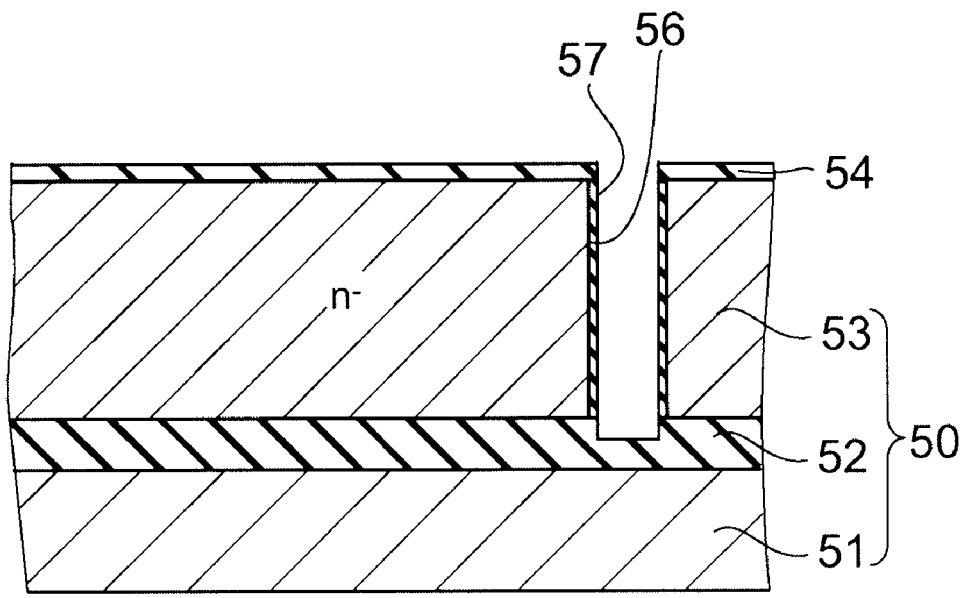

Next, as shown in FIG. 14, thermal oxidation is performed. Thus, a silicon oxide film 57 having a thickness of e.g. 10 nm is formed on the side surface of the deep trench 56. Consequently, damage caused by dry etching is removed on the side surface of the deep trench 56.

Figure 15:
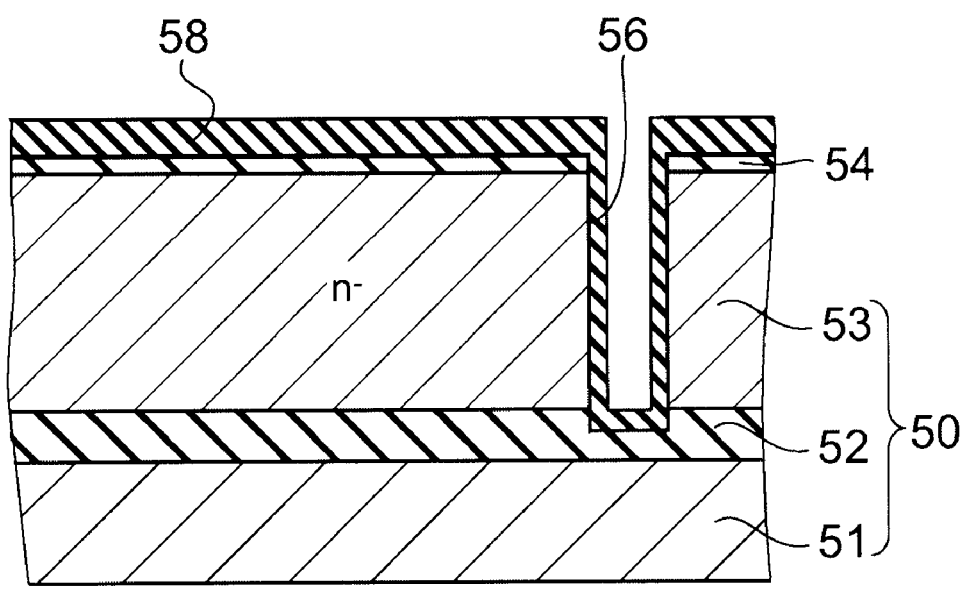

Next, as shown in FIG. 15, silicon oxide is deposited to a thickness of 400 nm illustratively by the LP-CVD method. Thus, a silicon oxide film 58 is formed on the upper surface of the silicon nitride film 54 and on the inner surface of the deep trench 56. Because the opening width of the deep trench 56 is 2 μm (=2000 nm), the deep trench 56 is not occluded by the silicon oxide film 58 having a thickness of 400 nm. The silicon oxide film 57 (see FIG. 14) is integrated with the silicon oxide film 58.

Figure 16:
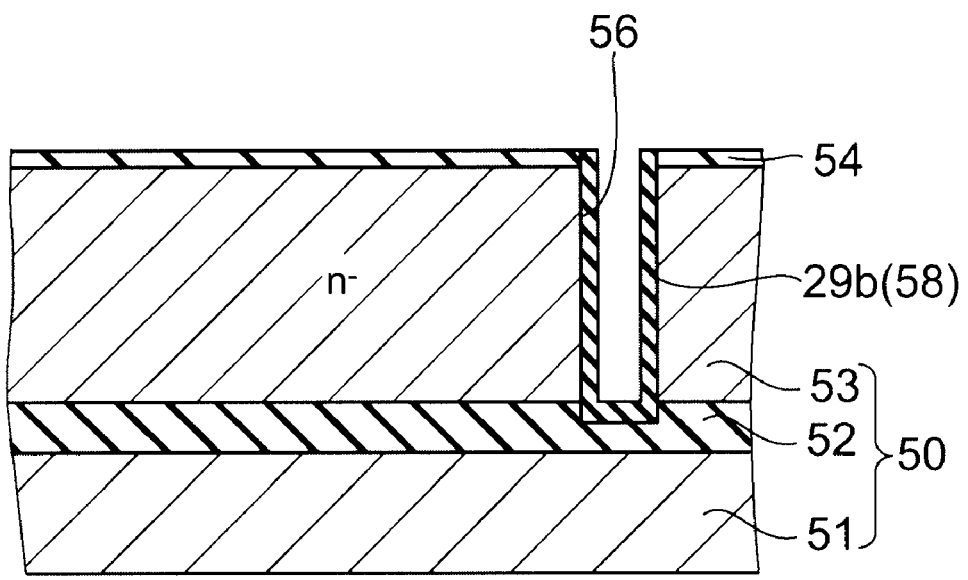

Next, as shown in FIG. 16, the silicon nitride film 54 is used as a stopper to perform CMP (chemical mechanical polishing) to remove the silicon oxide film 58 deposited on the silicon nitride film 54. Thus, the silicon oxide film 58 remains only on the inner surface of the deep trench 56 and constitutes a coating layer 29b.

Figure 17:
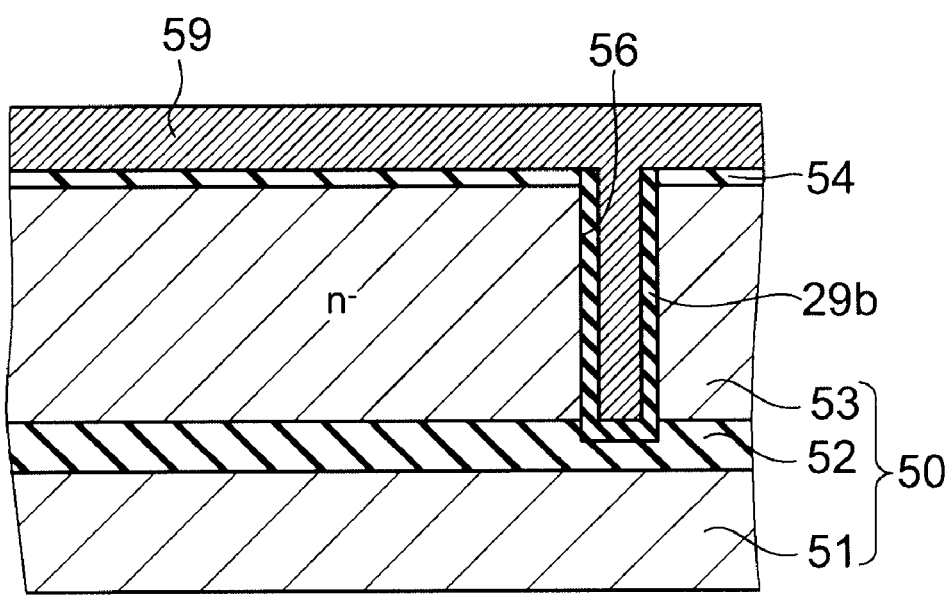

Next, as shown in FIG. 17, phosphorus-doped polysilicon is deposited to a thickness of e.g. 0.8 μm. Thus, a polysilicon film 59 is formed on the upper surface of the silicon nitride film 54 and inside the deep trench 56. Here, the inside of the deep trench 56 is completely filled with the polysilicon film 59.

Figure 18:
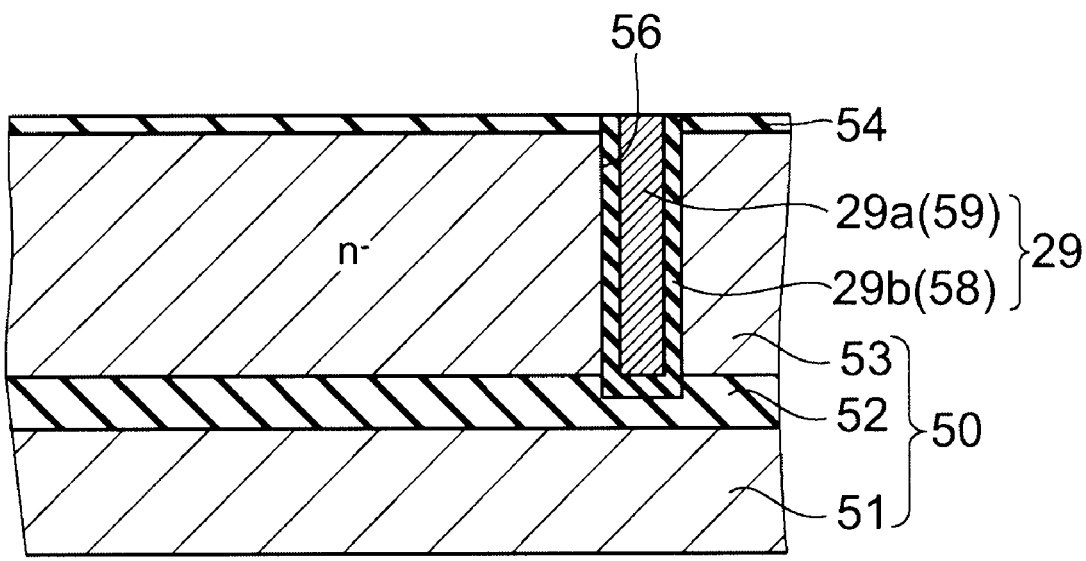

Next, as shown in FIG. 18, the silicon nitride film 54 is used as a stopper to perform CMP to remove the polysilicon film 59 deposited on the silicon nitride film 54. Thus, the polysilicon film 59 remains only inside the deep trench 56 and constitutes a core 29a. Thus, a marker 29 penetrating through the silicon layer 53 and composed of the core 29a and the coating layer 29b is formed. The marker 29 as viewed from above is shaped as shown in FIG. 4.

The marker 29 is used as a fiducial mark for alignment in subsequent lithography processes on the upper surface and lower surface of the silicon layer 53. The core 29a of polysilicon provided in the marker 29 ensures conduction between the upper surface and the lower surface of the silicon layer 53. Furthermore, the core 29a is coated therearound with the coating layer 29b of silicon oxide. This insulates the core 29a from the silicon layer 53 to prevent current leakage, and enhances the contrast of the marker 29 to the silicon layer 53 in observing the upper surface and the lower surface of the silicon layer 53 by an electron microscope and the like to perform alignment. In this embodiment, the same marker 29 is used for both purposes of alignment and conduction. However, it is also possible to separately form a marker for alignment and a marker for conduction.

Next, by the following process, an insulating member 23 (see FIG. 28) is buried in an upper portion of the silicon layer 53.

Figure 19:
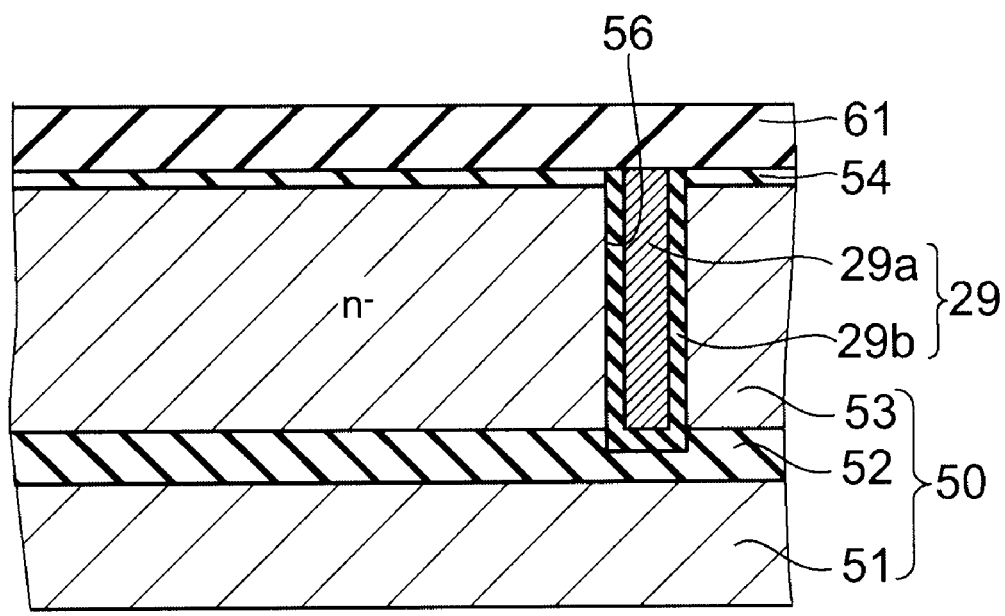

First, as shown in FIG. 19, BSG is deposited on the silicon nitride film 54 by the LP-CVD method to form a BSG film 61. The BSG film 61 has a thickness of e.g. 100 nm.

Figure 20:
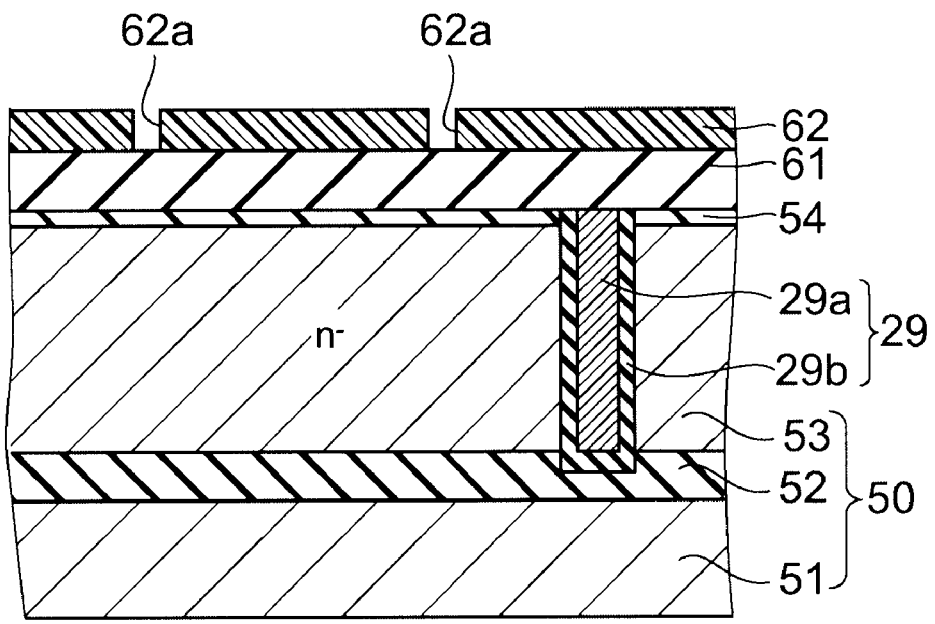

Next, as shown in FIG. 20, a resist material is applied on the BSG film 61 to form a resist mask 62. Then, exposure and development are performed on a region intended for a trench 22 (see FIG. 22) to form an opening 62a in this region. As viewed from above, the opening 62a is shaped like a lattice, and the opening width is illustratively 0.25 μm.

Figure 21:
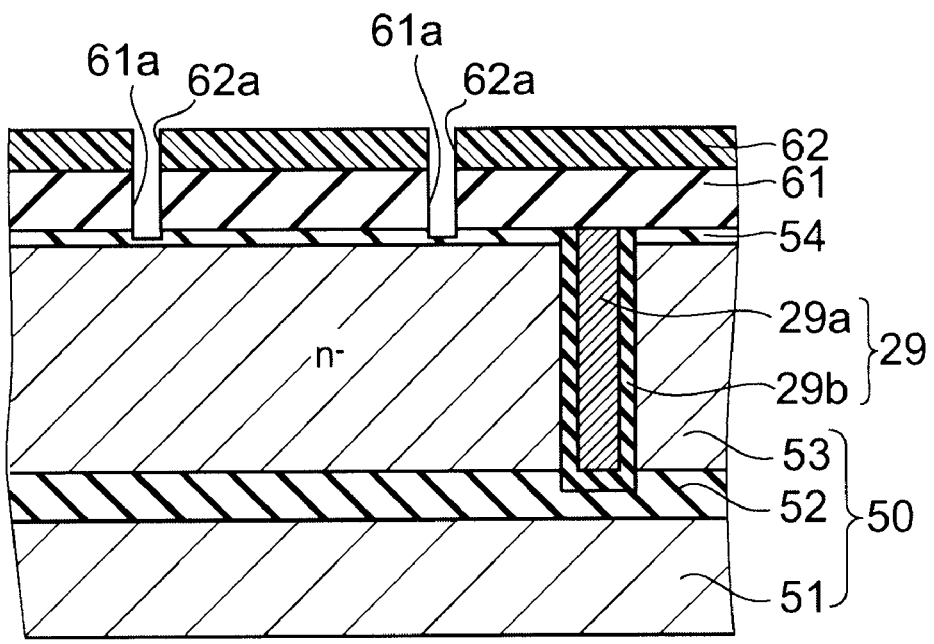

Next, as shown in FIG. 21, the resist mask 62 is used as a mask to perform dry etching. Thus, the BSG film 61 located immediately below the opening 62a is selectively removed, and an opening 61a is formed. This dry etching is stopped upon reaching the silicon nitride film 54. Subsequently, the resist mask 62 is removed.

Figure 22:
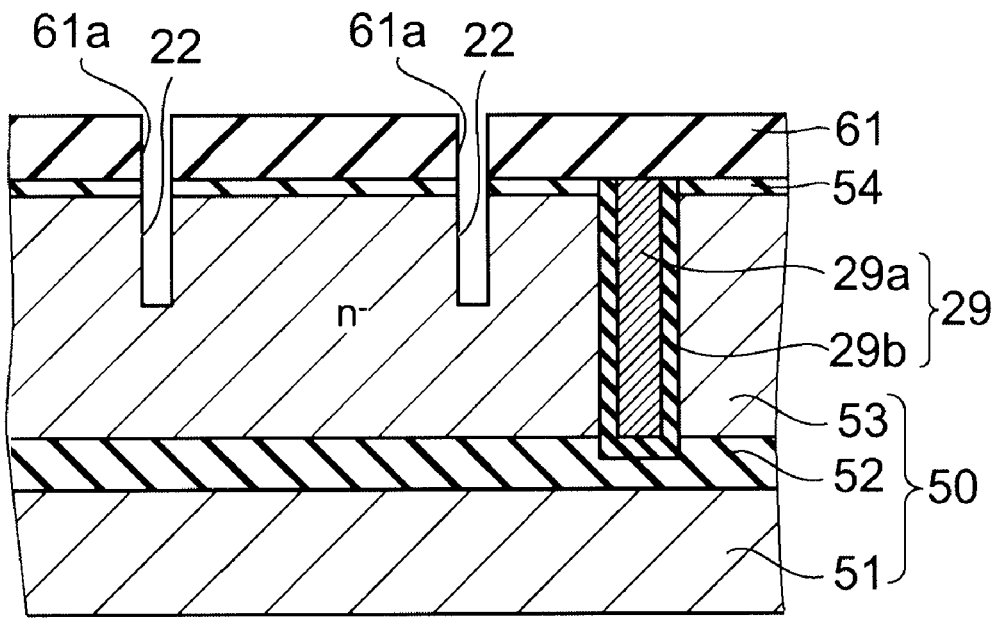

Next, as shown in FIG. 22, the patterned BSG film 61 is used as a mask to perform dry etching. Thus, an upper portion of the silicon layer 53 immediately below the opening 61a is selectively removed, and a trench 22 is formed. The trench 22 has a depth of e.g. 2 μm. At this time, residues (deposits) are generated.

Figure 23:
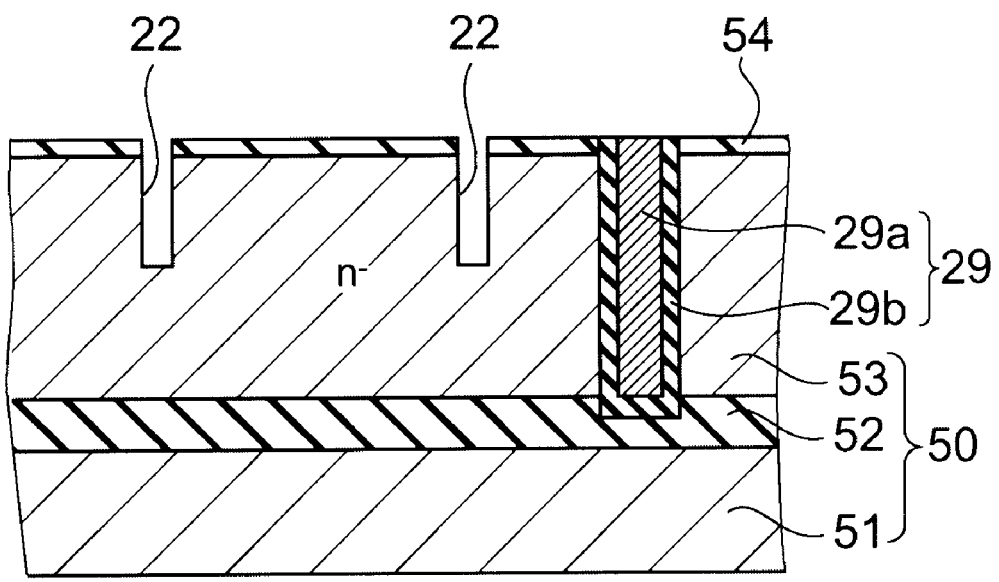

Next, as shown in FIG. 23, by hydrogen fluoride vapor (HF-vapor) treatment, the BSG film 61 (see FIG. 22) and the residues (not shown) are removed. Next, thermal oxidation is performed. Thus, a thermal oxide film (not shown) having a thickness of e.g. 4 nm is formed on the inner surface of the trench 22. This thermal oxide film functions as a diffusion prevention layer for preventing solid-phase diffusion of BSG by heat treatment after BSG is buried in the trench 22 by a subsequent process.

Figure 24:
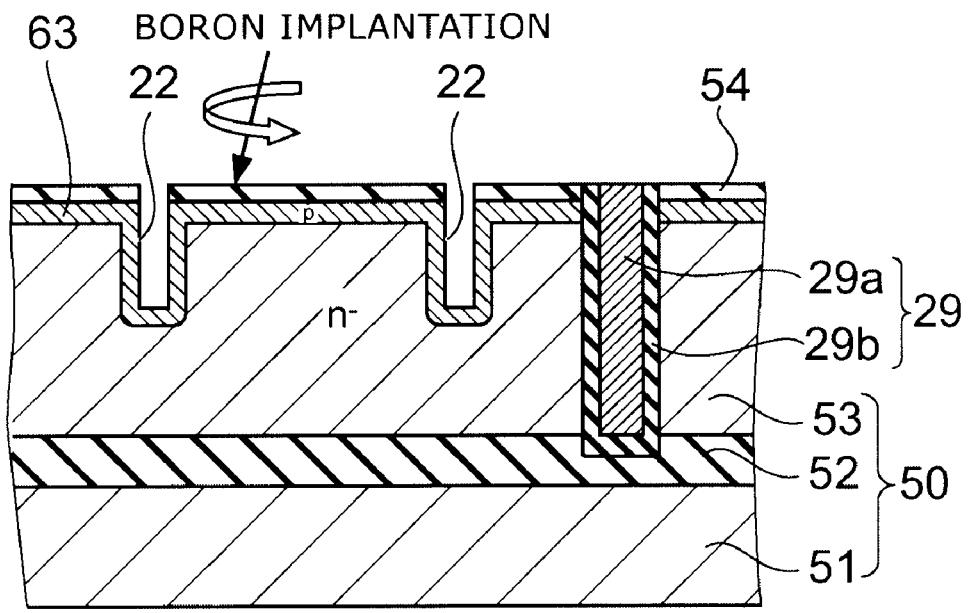

Next, as shown in FIG. 24, boron is ion-implanted into the entire surface. Here, the implantation direction of boron is tilted with respect to the direction (vertically downward direction) perpendicular to the upper surface of the silicon nitride film 54. The tilt angle of this implantation direction with respect to the vertically downward direction is illustratively 3°. Then, the implantation direction is rotated about an axis in the vertically downward direction, and implantation is successively performed in four directions, for instance. Thus, boron is implanted into the uppermost portion of the silicon layer 53, and also implanted into the inner surface of the trench 22. Consequently, a boron implanted region 63 is formed in the uppermost portion of the silicon layer 53 and around the trench 22.

Figure 25:
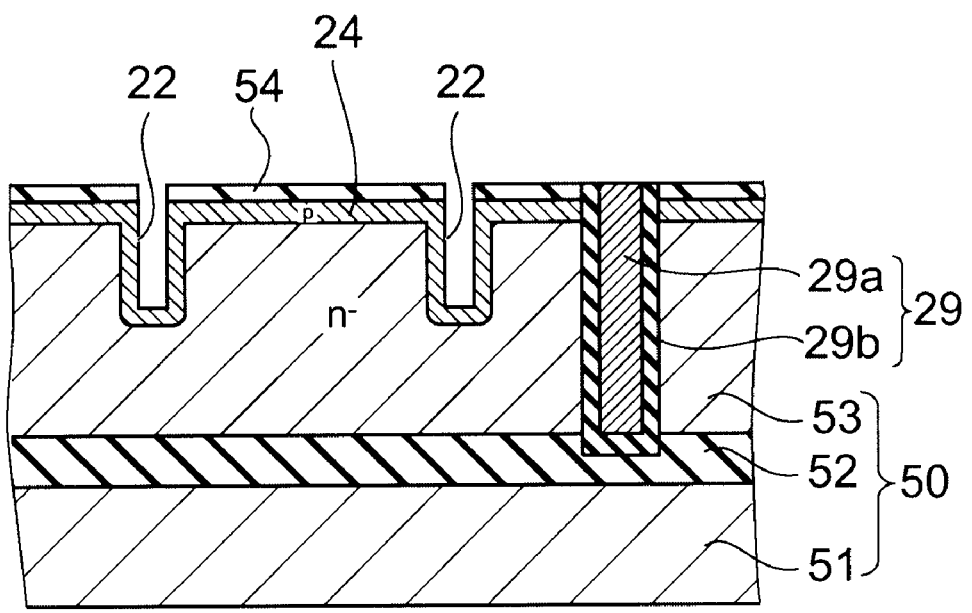

Next, as shown in FIG. 25, heat treatment is performed to activate boron in the boron implanted region 63. This heat treatment is performed illustratively by spike RTA (rapid thermal anneal) with a maximum attained temperature of 1090° C. Thus, a p-type region 24 is formed in the uppermost portion of the silicon layer 53 and around the trench 22. The p-type region 24 has a thickness of e.g. 0.1 μm. In this process, to prevent thermal diffusion of atoms in the subsequent process, impurities are diffused and activated in advance at a higher temperature than the subsequent thermal processes.

Figure 26:
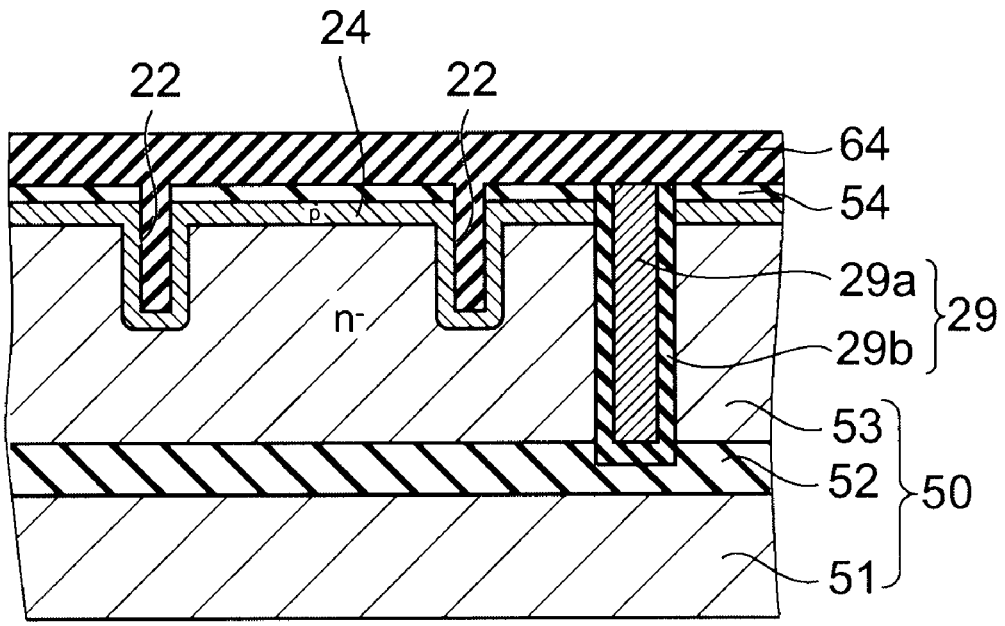

Next, as shown in FIG. 26, BSG is deposited to a thickness of e.g. 200 nm. Thus, a BSG film 64 is formed on the upper surface of the silicon nitride film 54 and inside the trench 22. The thickness of the BSG film 64 is arbitrary as long as the trench 22 can be completely filled therewith.

Figure 27:
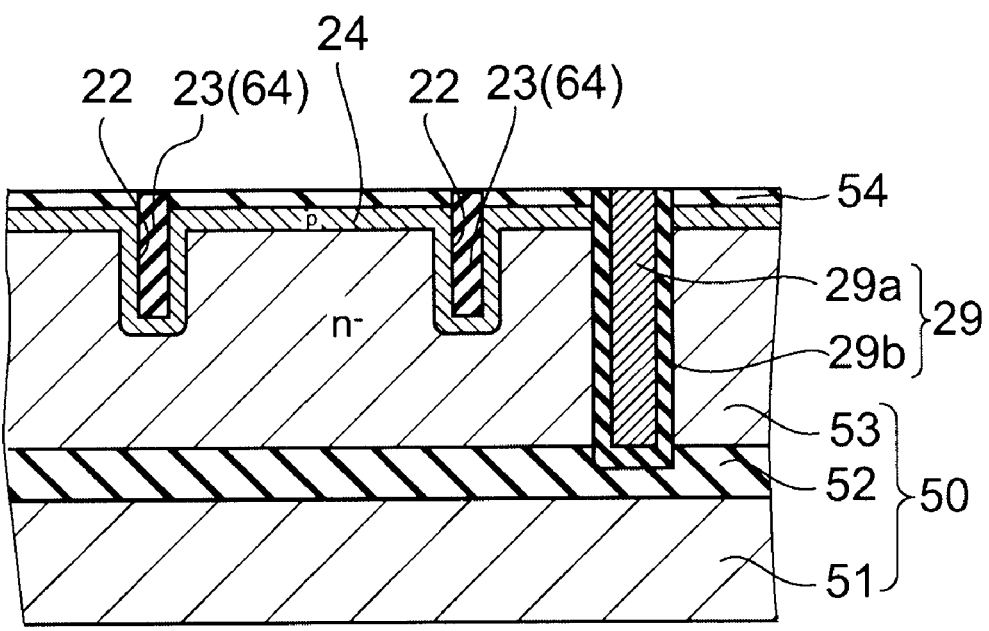

Next, as shown in FIG. 27, the silicon nitride film 54 is used as a stopper to perform CMP to remove the BSG film 64 deposited on the silicon nitride film 54. Thus, the BSG film 64 remains only inside the trench 22 and constitutes an insulating member 23. Thus, the insulating member 23 is buried in the upper portion of the silicon layer 53.

Next, by the following process, a p-type region 21 (see FIG. 38) is formed in a lower portion of the silicon layer 53.

Figure 28:
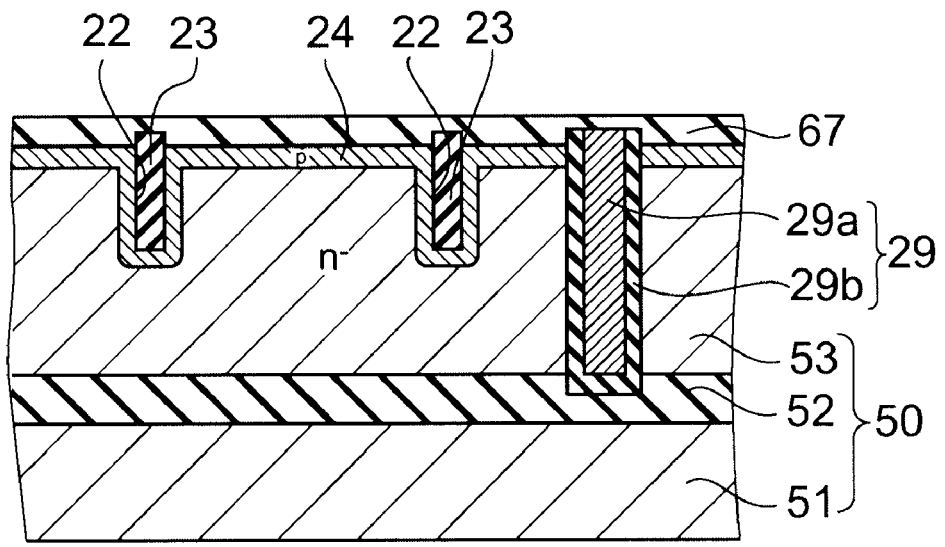

First, as shown in FIG. 28, silicon nitride is further deposited on the silicon nitride film 54 (see FIG. 27) by the LP-CVD method. The deposition thickness at this time is illustratively 30 nm. Thus, a silicon nitride film 67 is formed from the silicon nitride film 54 and the newly deposited silicon nitride. The silicon nitride film 67 has a thickness of e.g. 30-60 nm. The insulating member 23 is covered with the silicon nitride film 67.

Figure 29:
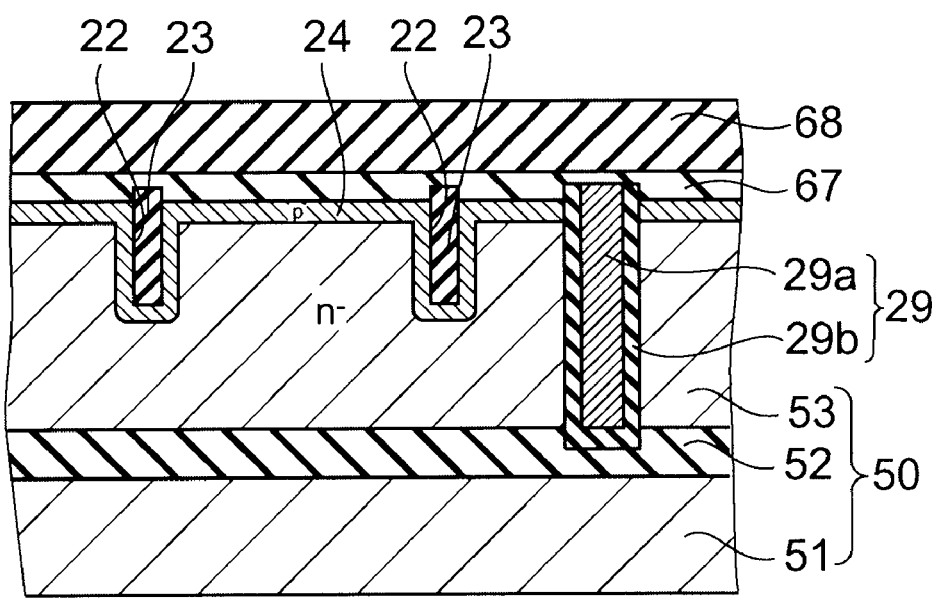

Next, as shown in FIG. 29, silicon oxide is deposited on the silicon nitride film 67 by the LP-CVD method using TEOS as a raw material. Thus, a TEOS film 68 having a thickness of e.g. 200 nm is formed.

Figure 30:
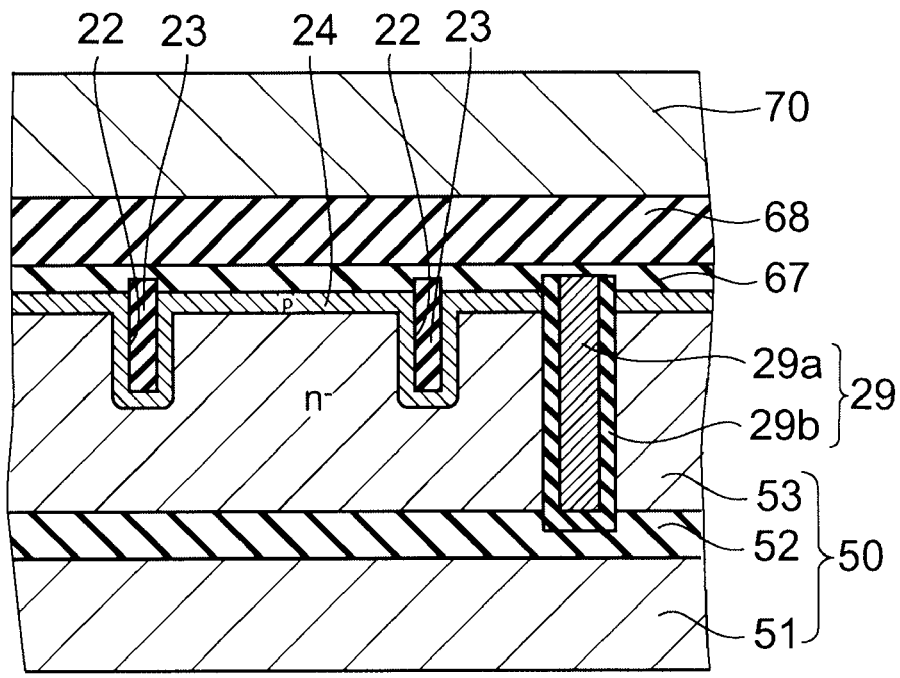

Next, as shown in FIG. 30, a support substrate 70 is laminated on the upper surface of the TEOS film 68. The support substrate 70 is illustratively a silicon wafer. This lamination is performed illustratively by plasma bonding.

Figure 31:
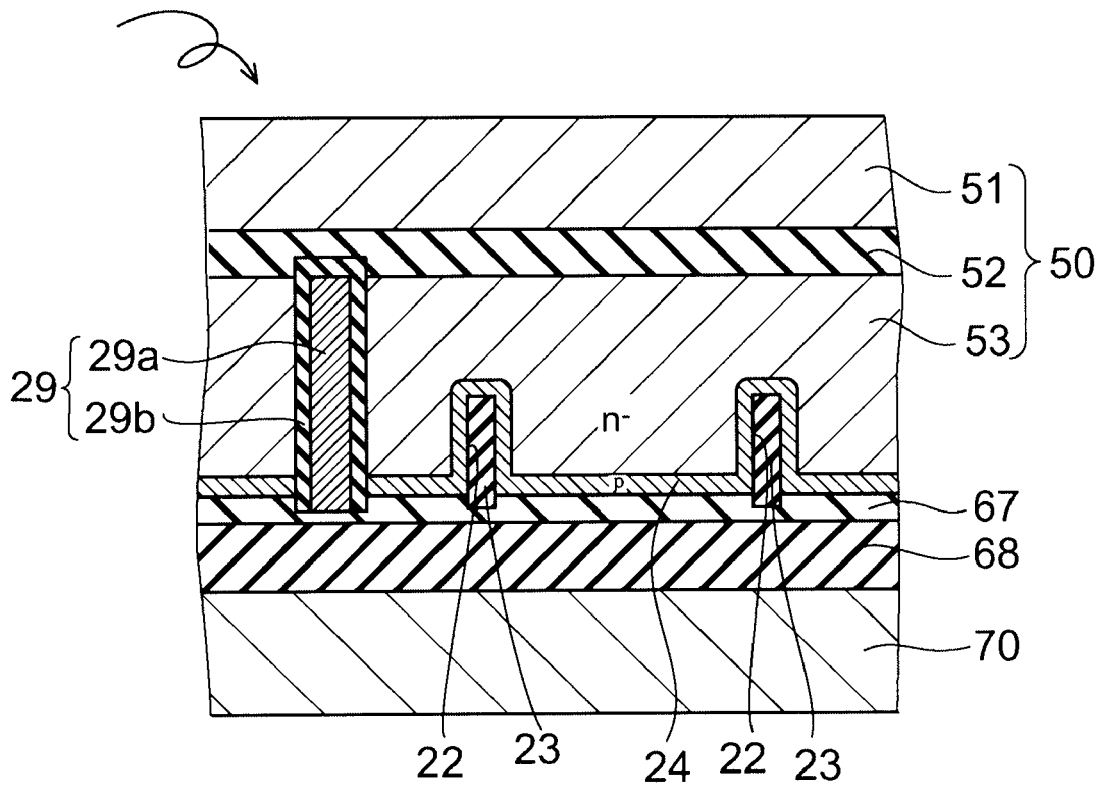

Next, as shown in FIG. 31, the structure of the SOI substrate 50, the TEOS film 68, and the support substrate 70 stacked therein is turned upside down. Thus, the lower surface of the base member 51 of the SOI substrate 50 now serves as a surface under processing. To unify the notation, also in the following description, like the foregoing, the base member 51 side is referred to as "below", and the support substrate 70 side is referred to as "above".

Figure 32:
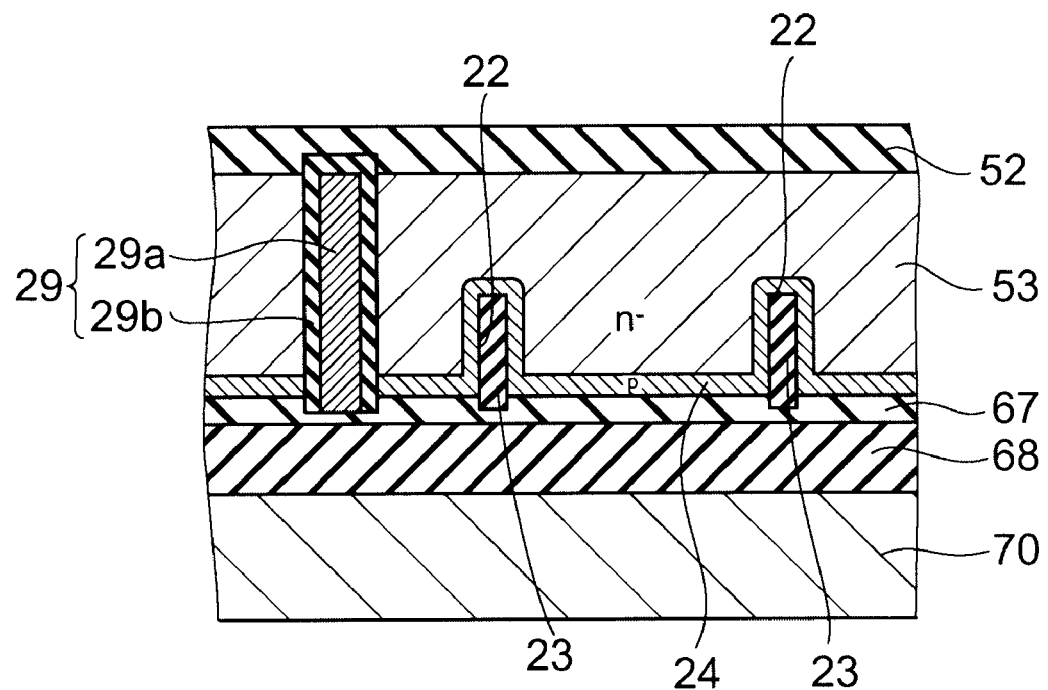

Next, as shown in FIG. 32, grinding is performed on the base member 51 (see FIG. 31) using the BOX oxide film 52 as a stopper to remove the base member 51.

Figure 33:
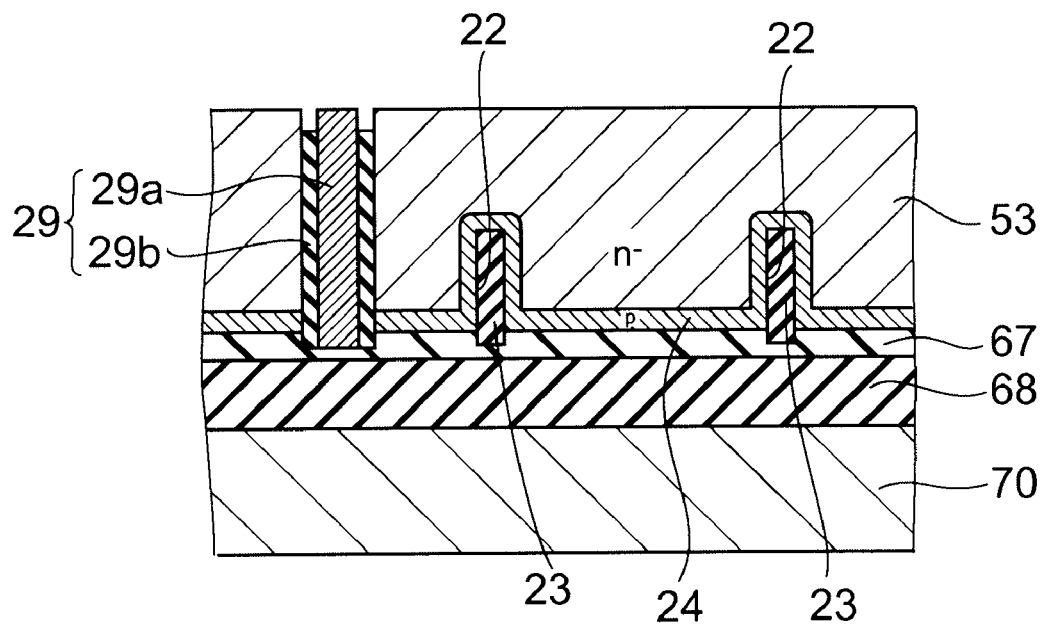

Next, as shown in FIG. 33, hydrofluoric acid treatment is performed to remove the BOX oxide film 52 (see FIG. 32). Thus, the lower surface of the silicon layer 53 is exposed. Furthermore, the lower surface of the marker 29 is also exposed, and the coating layer 29b made of silicon oxide is set back from the lower surface of the silicon layer 53. Thus, the thickness of the SOI substrate 50 (see FIG. 31) is reduced from its lower surface side.

Figure 34:
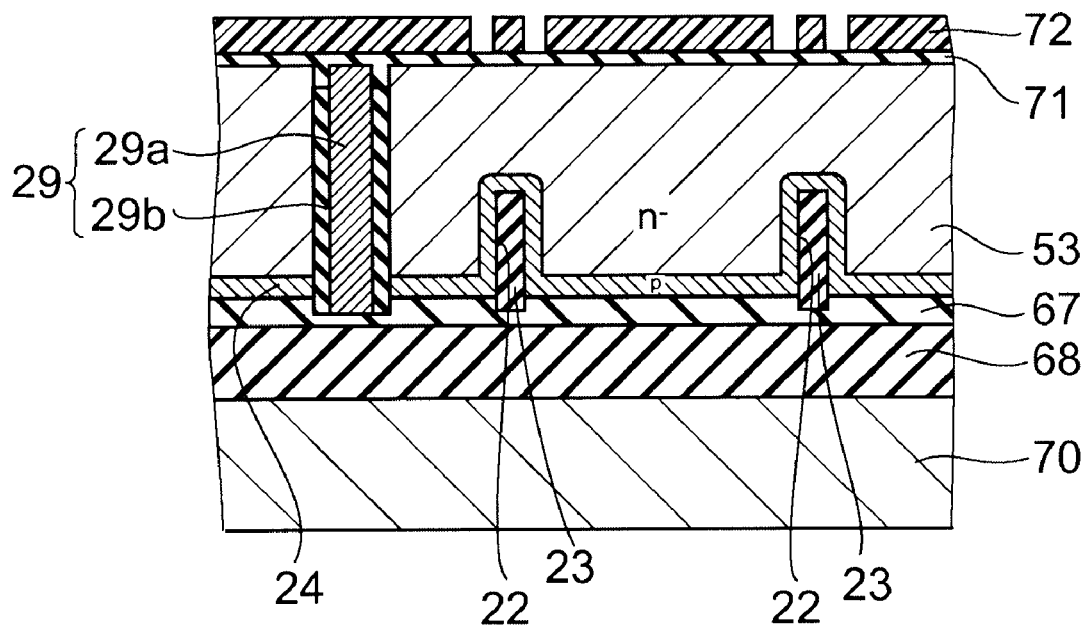

Next, as shown in FIG. 34, silicon nitride is deposited to a thickness of e.g. 120 nm on the lower surface of the silicon layer 53 (thereabove in the figure). Thus, a silicon nitride film 71 is formed. Subsequently, a resist material is applied to form a resist mask 72 having a thickness of e.g. 0.3 μm, and a region intended for a device isolation region is opened by lithography. At this time, the marker 29 is used for alignment in the lithography.

Figure 35:
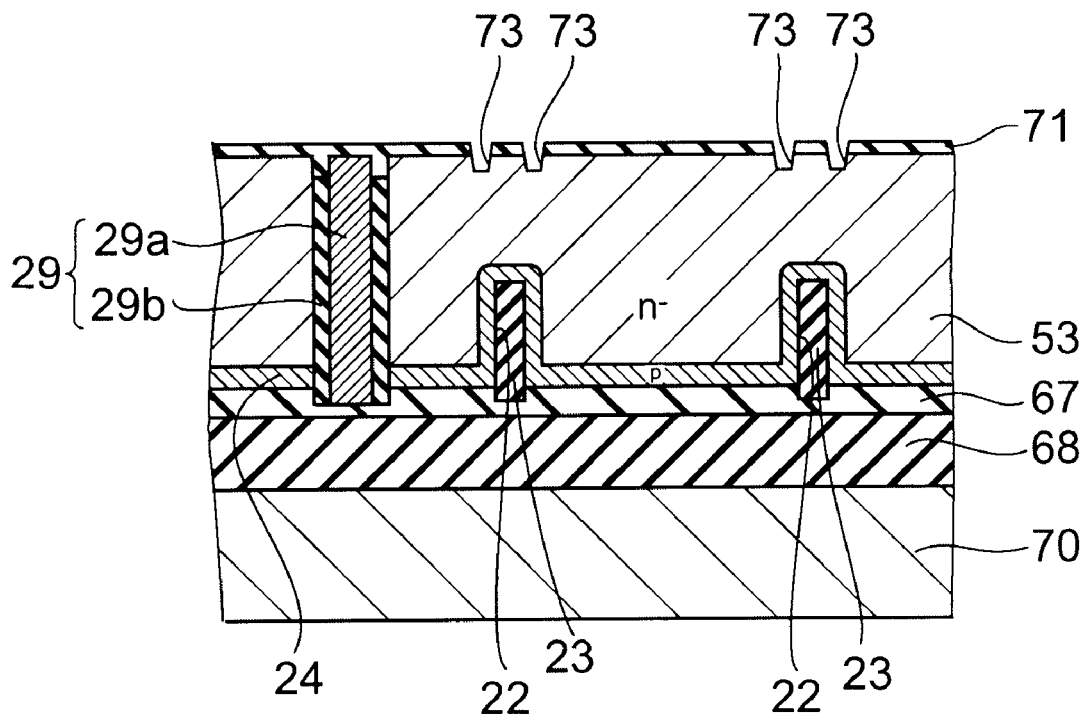

Next, as shown in FIG. 35, the resist mask 72 (see FIG. 34) is used as a mask to perform dry etching to pattern the silicon nitride film 71. Subsequently, the resist mask 72 is stripped. Next, the patterned silicon nitride film 71 is used as a mask to perform dry etching. Thus, the lowermost portion (uppermost portion in the figure) of the silicon layer 53 is selectively removed to form a recess 73. The recess 73 is formed on both sides of the immediately underlying region of the trench 22.

Figure 36:
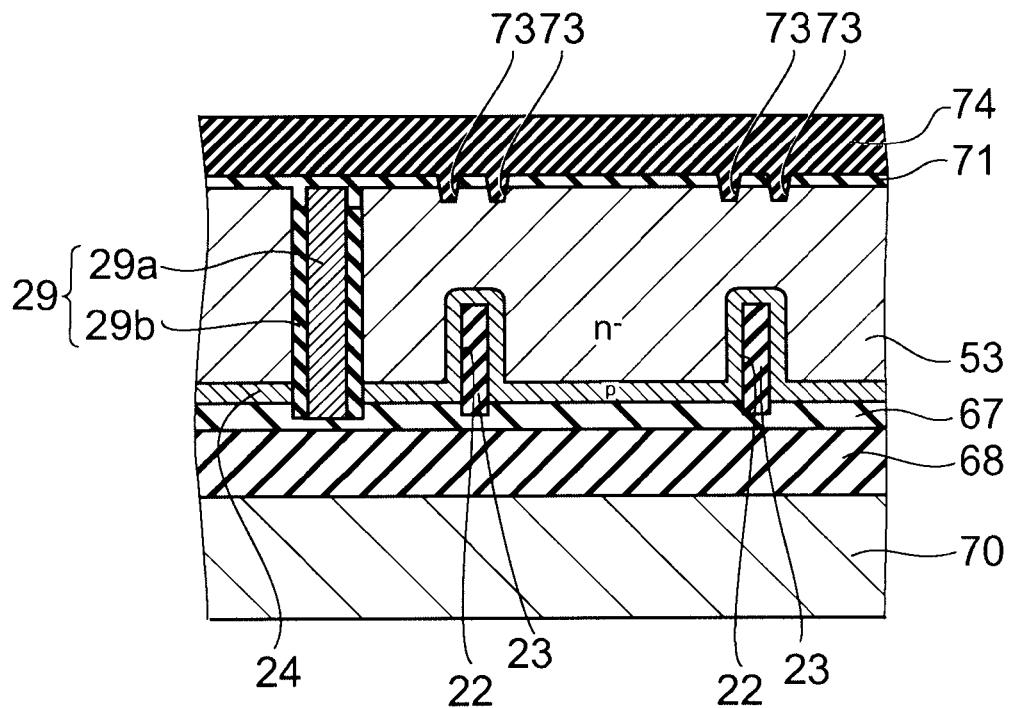

Next, as shown in FIG. 36, USG (undoped silicon glass, or undoped silicon oxide) is deposited to a thickness of e.g. 550 nm to form an USG film 74 on the lower surface of the silicon nitride film 71. The USG film 74 is buried also in the recess 73.

Figure 37:
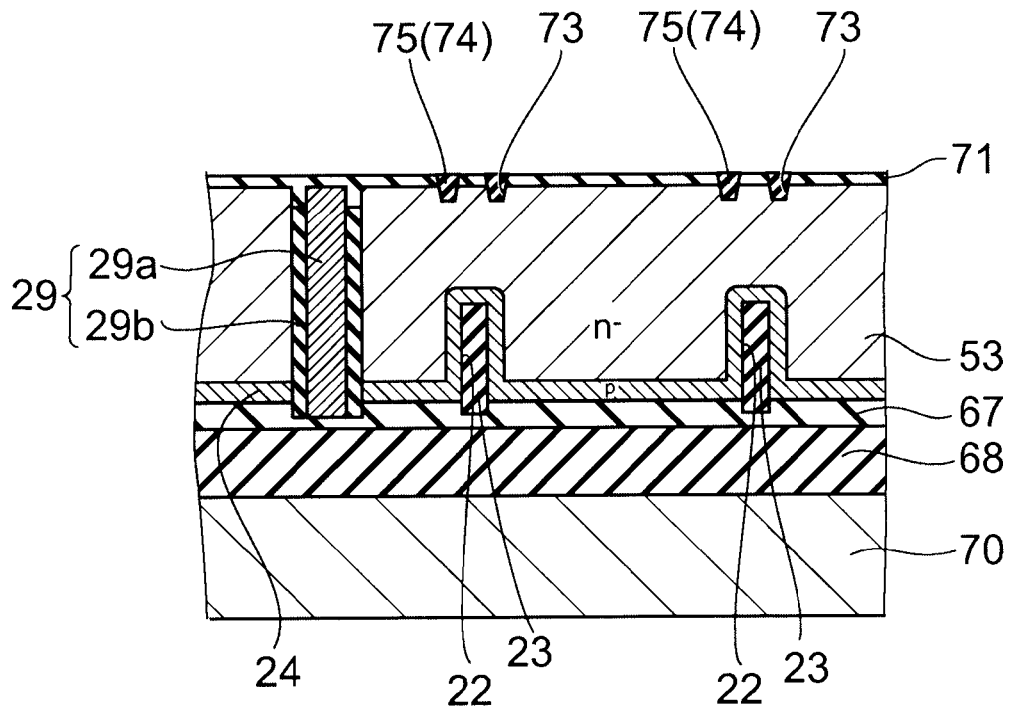

Next, as shown in FIG. 37, the silicon nitride film 71 is used as a stopper to perform CMP on the USG film 74. Thus, the USG film 74 is removed from above the lower surface of the silicon nitride film 71, and left only in the recess 73. The USG film 74 remaining in the recess 73 constitutes a device isolation insulating film 75.

Figure 38:
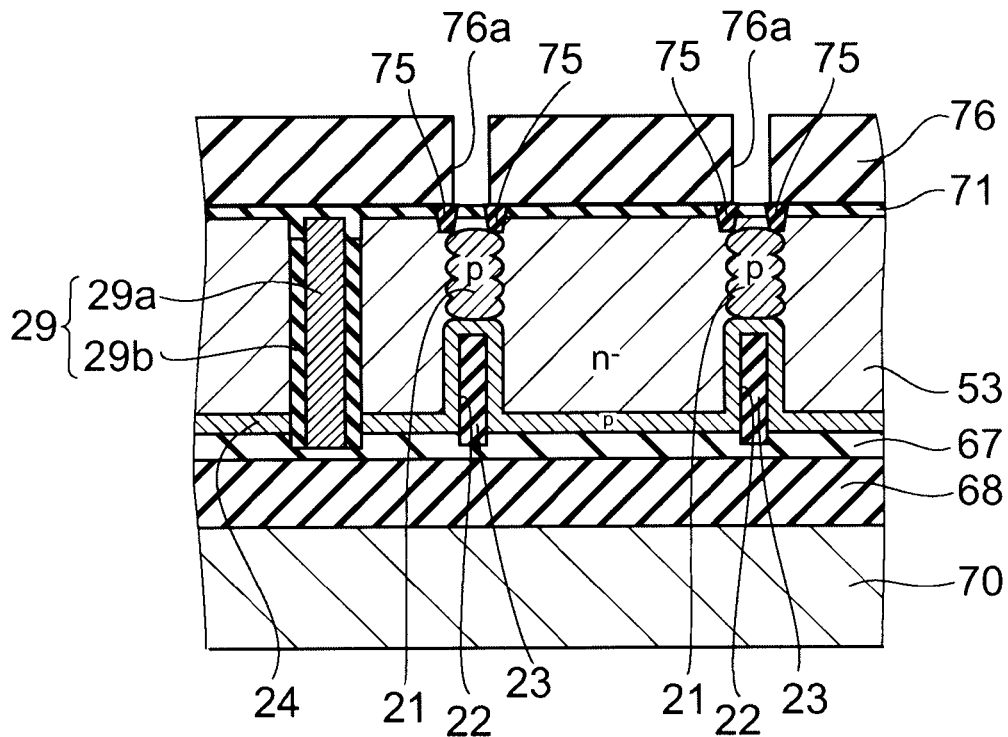

Next, as shown in FIG. 38, a resist is applied onto the lower surface of the silicon nitride film 71 to form a resist mask 76. Then, using the marker 29 for alignment, exposure and development are performed on the resist mask 76 to form an opening 76a immediately below the trench 22. Next, the resist mask 76 is used as a mask to perform ion implantation of boron. This ion implantation is performed at an acceleration energy such that boron reaches the p-type region 24. Thus, a p-type region 21 is formed in the silicon layer 53 immediately below (in the figure, immediately above) the trench 22. As viewed from below, the p-type region 21 is shaped like a lattice, and connected to the p-type region 24.

Figure 39:
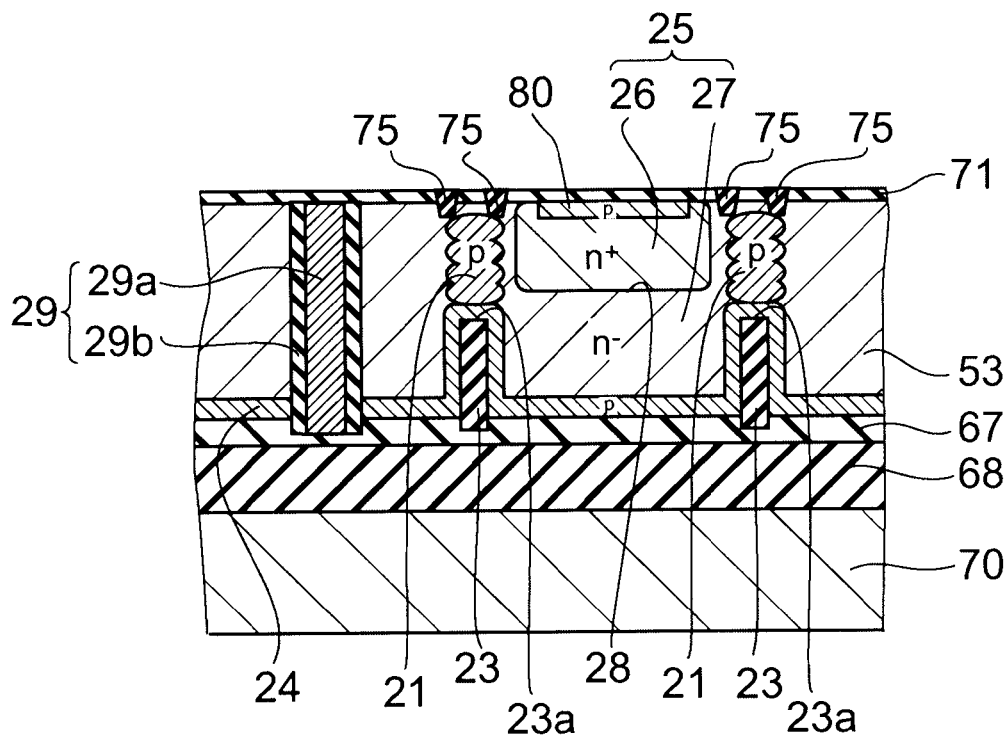

Next, as shown in FIG. 39, phosphorus is ion-implanted from the lower surface side of the silicon layer 53 into the region partitioned by the p-type region 21. Thus, a high-concentration region 26 having $n^+$-type conductivity is formed in a lower portion (upper portion in the figure) of this partitioned region. At this time, in the region partitioned by the p-type region 21, the portion which phosphorus does not reach, that is, the portion immediately above (in the figure, immediately below) the high-concentration region 26, constitutes a low-concentration region 27 having $n^-$-type conductivity.

Here, the high-concentration region 26 is formed more shallowly than the p-type region 21. Thus, the interface 28 between the high-concentration region 26 and the low-concentration region 27 is placed below (in the figure, above) the bottom surface 23a of the insulating member 23. The high-concentration region 26 and the low-concentration region 27 constitute a PD (photodiode) region 25. The phosphorus concentration profile along the vertical direction in the PD region 25 is as shown in FIG. 3. Next, boron is ion-implanted into the lowermost portion of the PD region 25 to form a p-type layer 80 having p-type conductivity.

Figure 40:
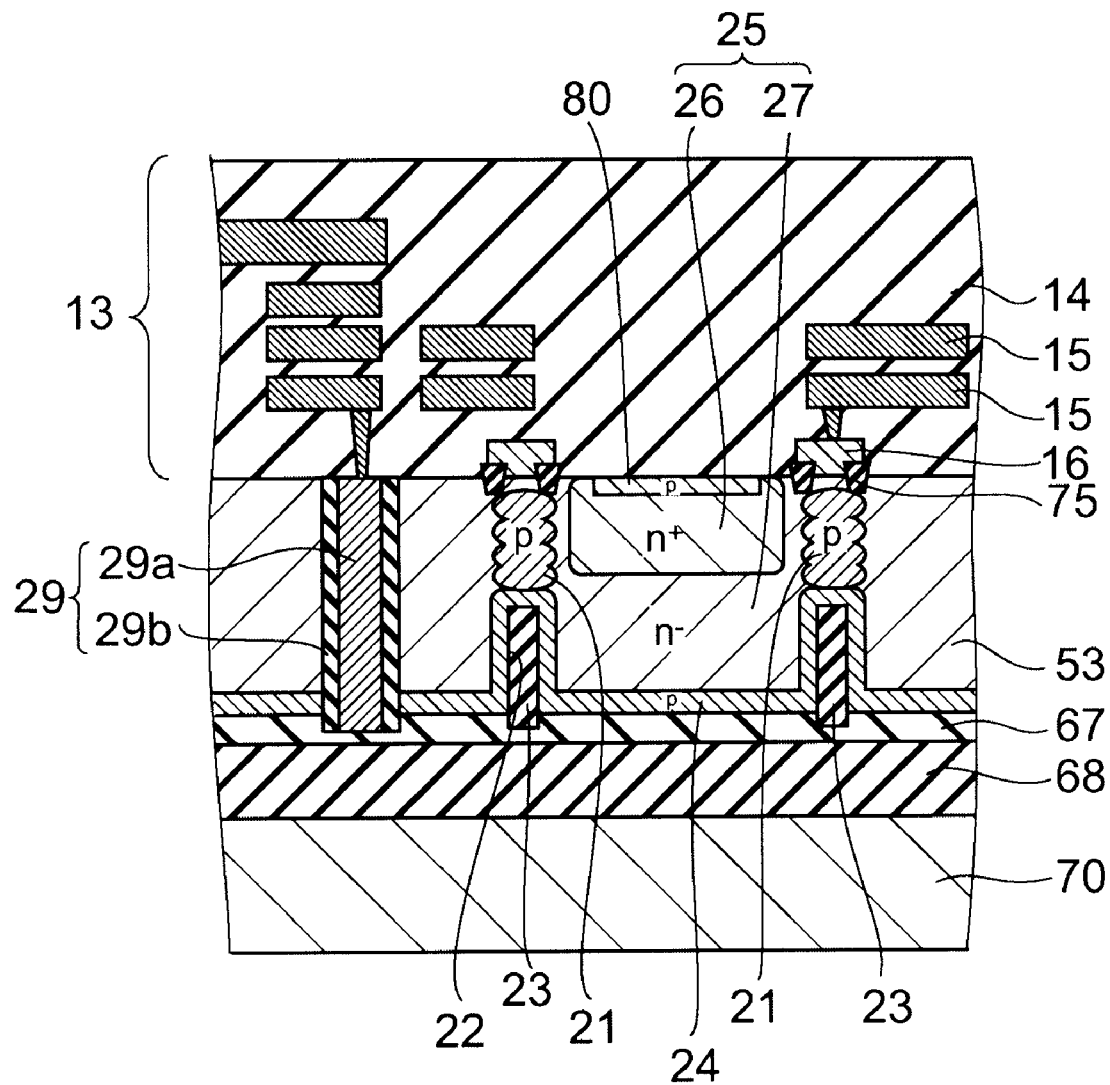

Next, as shown in FIG. 40, the silicon nitride film 71 (see FIG. 39) is removed. Next, a transfer gate 16 is formed in a region on the lower surface of the silicon layer 53 including the region immediately below the p-type region 21. Next, by the conventional method, interlayer insulating films 14 and metal interconnects 15 are alternately stacked on the lower surface of the silicon layer 53. Thus, a multilayer interconnect layer 13 as an interconnect structure is formed below the silicon layer 53. Here, part of the metal interconnect 15 is connected to the core 29a of the marker 29 through a contact.

Figure 41:
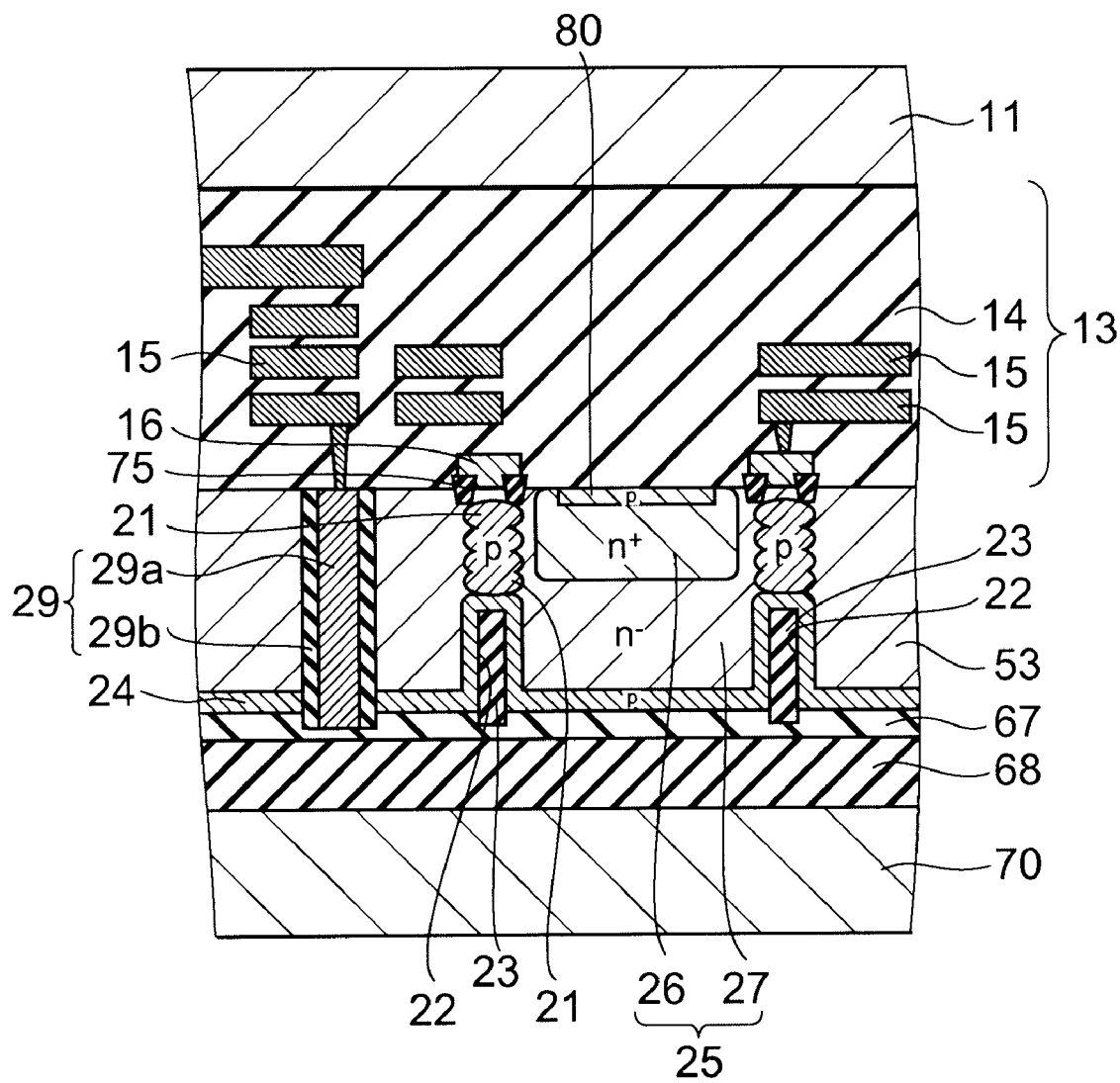

Next, as shown in FIG. 41, the lower surface of the multilayer interconnect layer 13 is planarized. Then, a support substrate 11 is laminated on the multilayer interconnect layer 13. The support substrate 11 is illustratively a silicon wafer.

Figure 42:
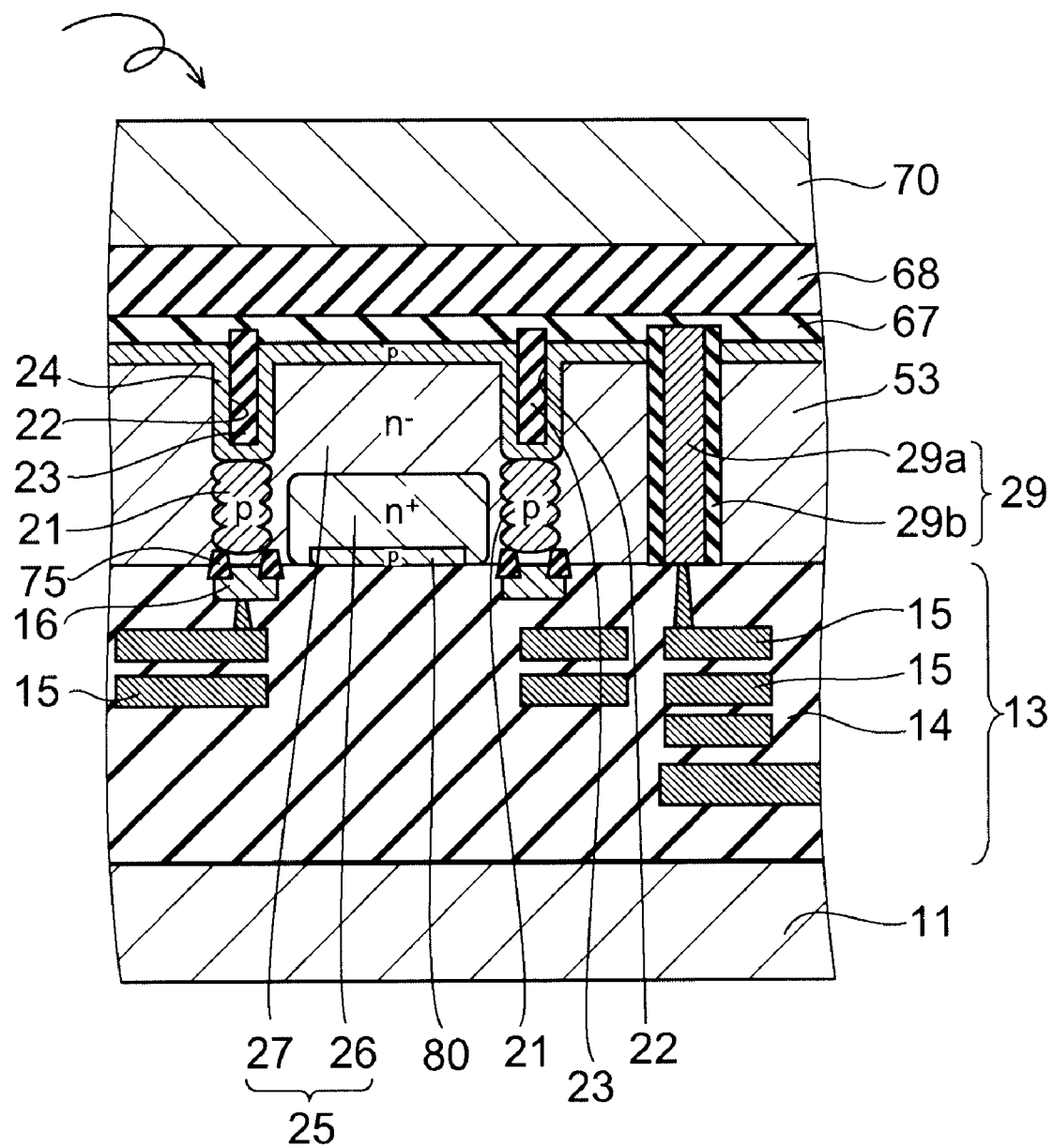

Next, as shown in FIG. 42, the structure of the support substrate 70, the TEOS film 68, the silicon nitride film 67, the silicon layer 53, the multilayer interconnect layer 13, and the support substrate 11 stacked therein is turned upside down once again. Thus, the upper surface of the support substrate 70 now serves as a surface under processing. Also in the following description, like the foregoing, the support substrate 11 side is referred to as "below", and the support substrate 70 side is referred to as "above".

Figure 43:
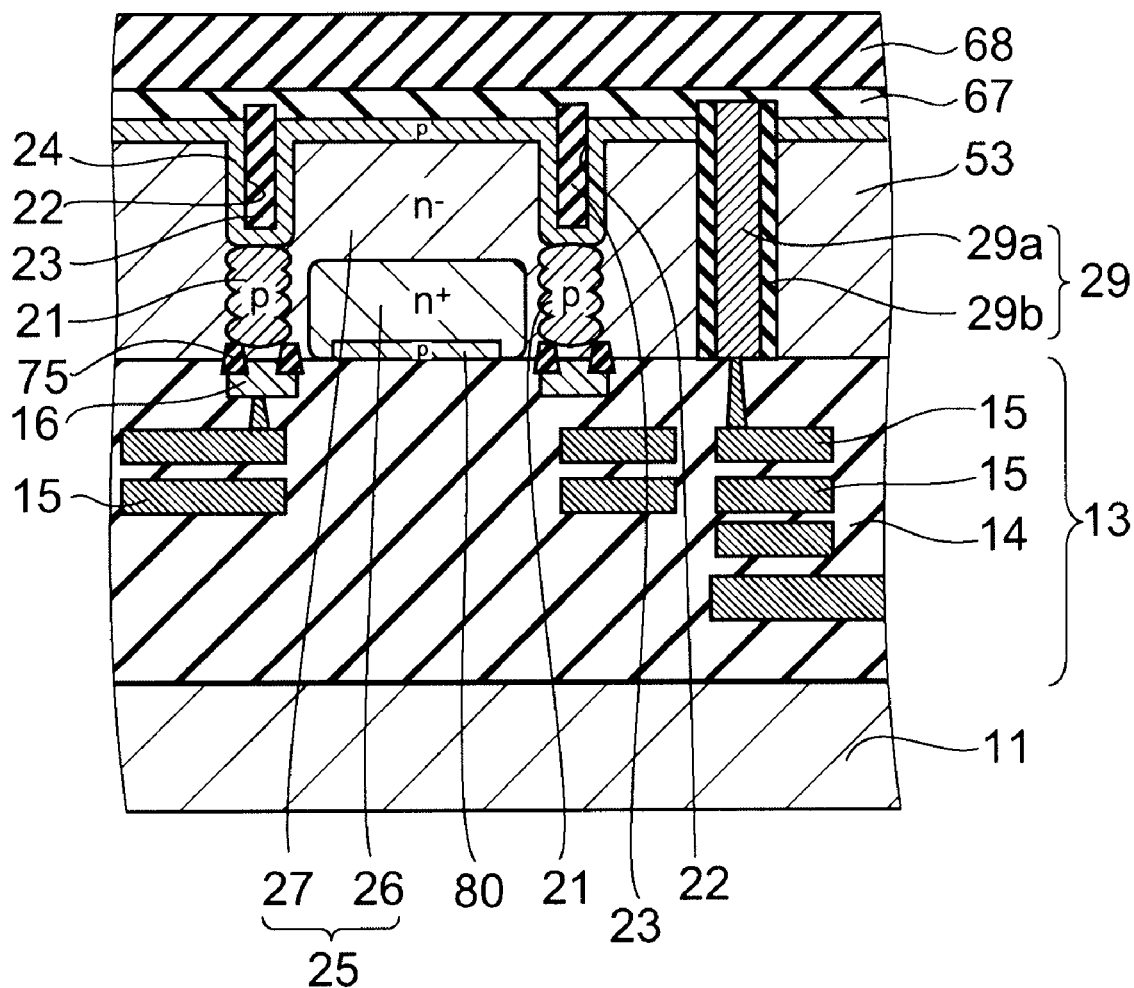

Next, as shown in FIG. 43, grinding is performed from the upper surface side of the support substrate 70 (see FIG. 42) using the TEOS film 68 as a stopper to remove the support substrate 70.

Figure 44:
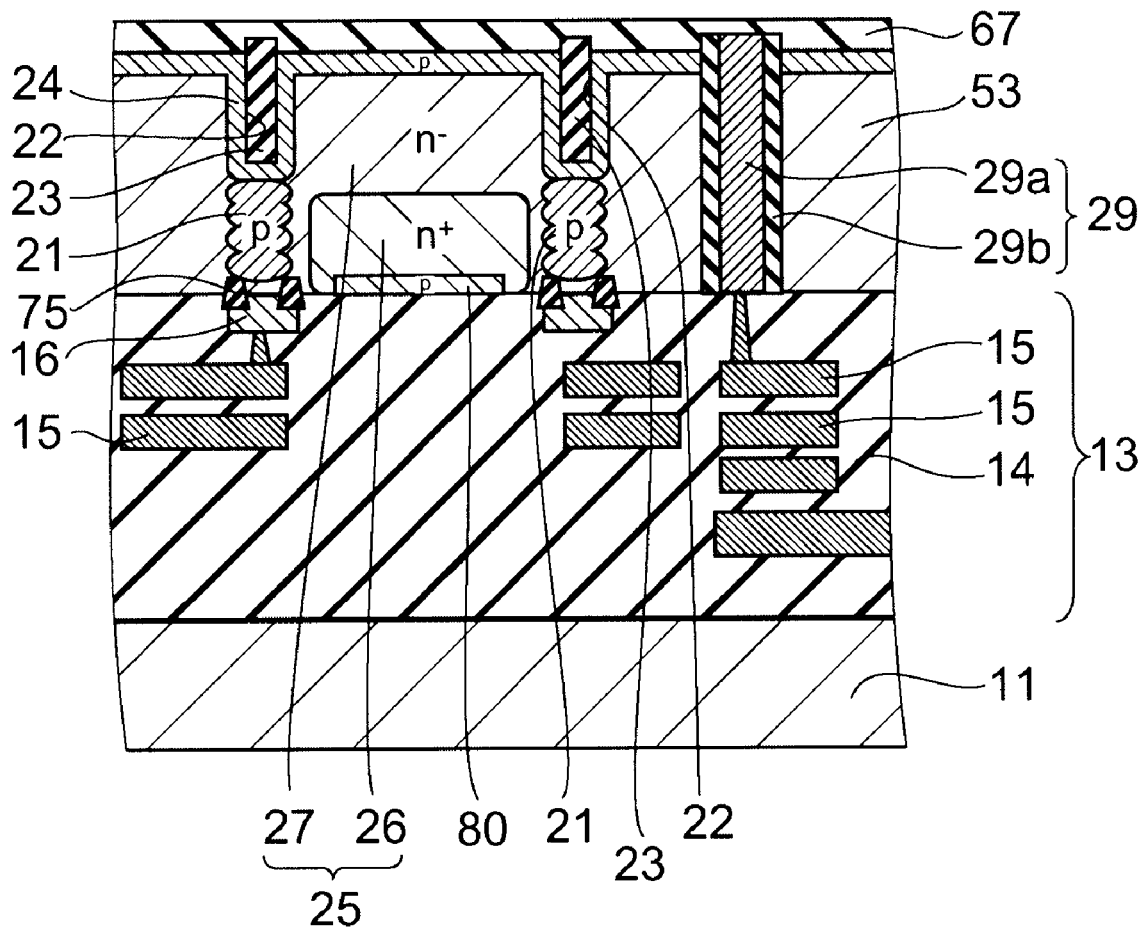

Next, as shown in FIG. 44, by a wet process using hydrofluoric acid, the TEOS film 68 (see FIG. 43) is removed. Thus, the silicon nitride film 67 is exposed.

Figure 45:
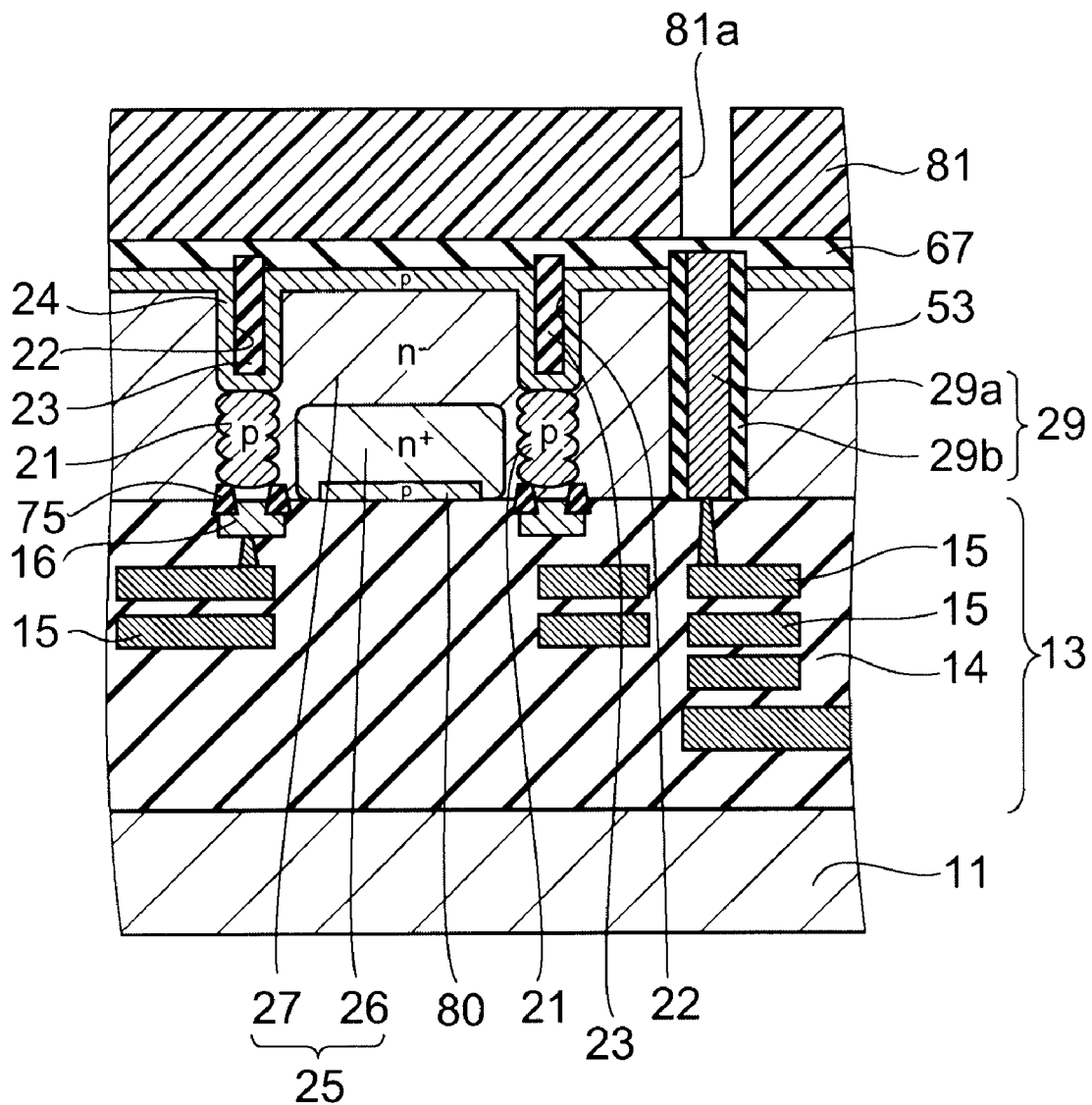

Next, as shown in FIG. 45, a resist material is applied onto the upper surface of the silicon nitride film 67 to form a resist mask 81. The resist mask 81 has a thickness of e.g. 0.85 μm. Next, using the marker 29 as a mark, exposure and development are performed to form an opening 81a in the resist mask 81 immediately above the marker 29.

Figure 46:
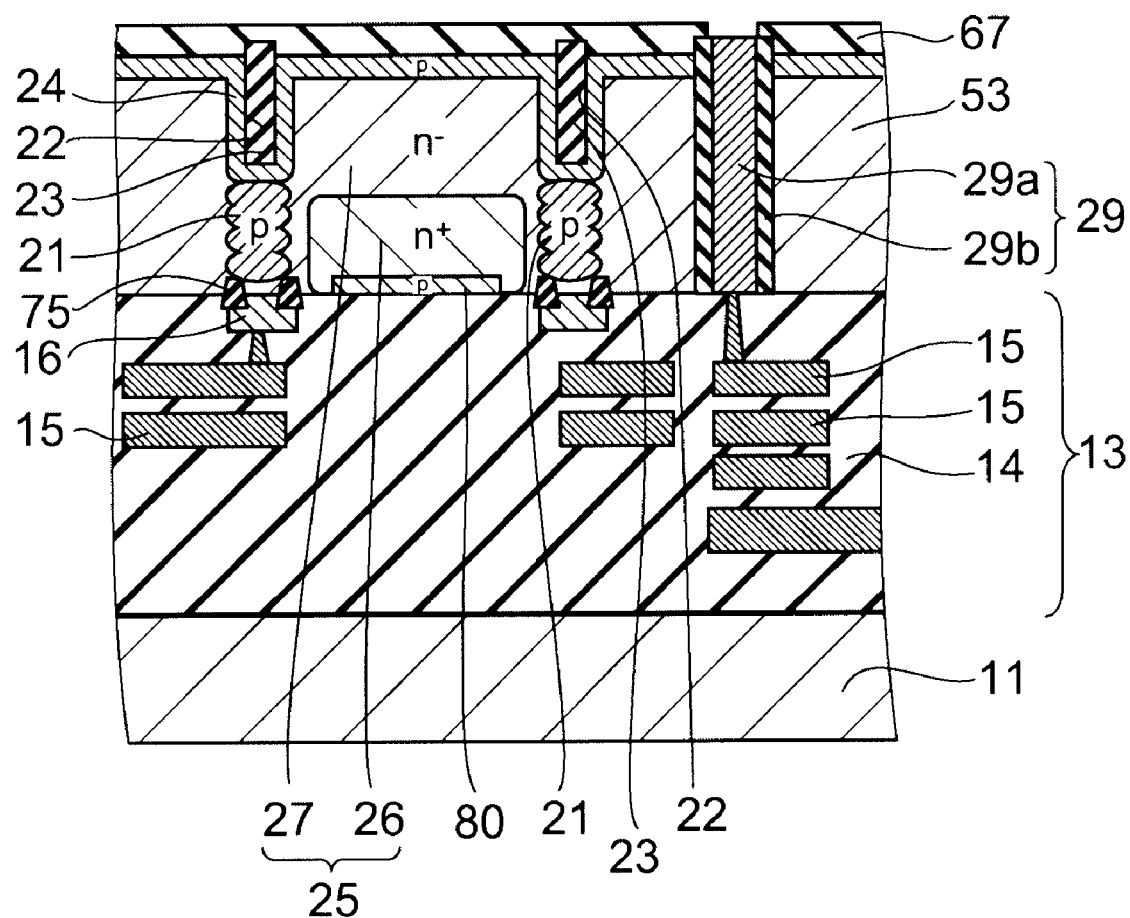

Next, as shown in FIG. 46, the resist mask 81 (see FIG. 45) is used as a mask to perform dry etching to remove the silicon nitride film 67 from immediately below the opening 81a, or immediately above the marker 29. Thus, the marker 29 is exposed. At this time, the core 29a of the marker 29 may be removed. Subsequently, the resist mask 81 is removed.

Figure 47:
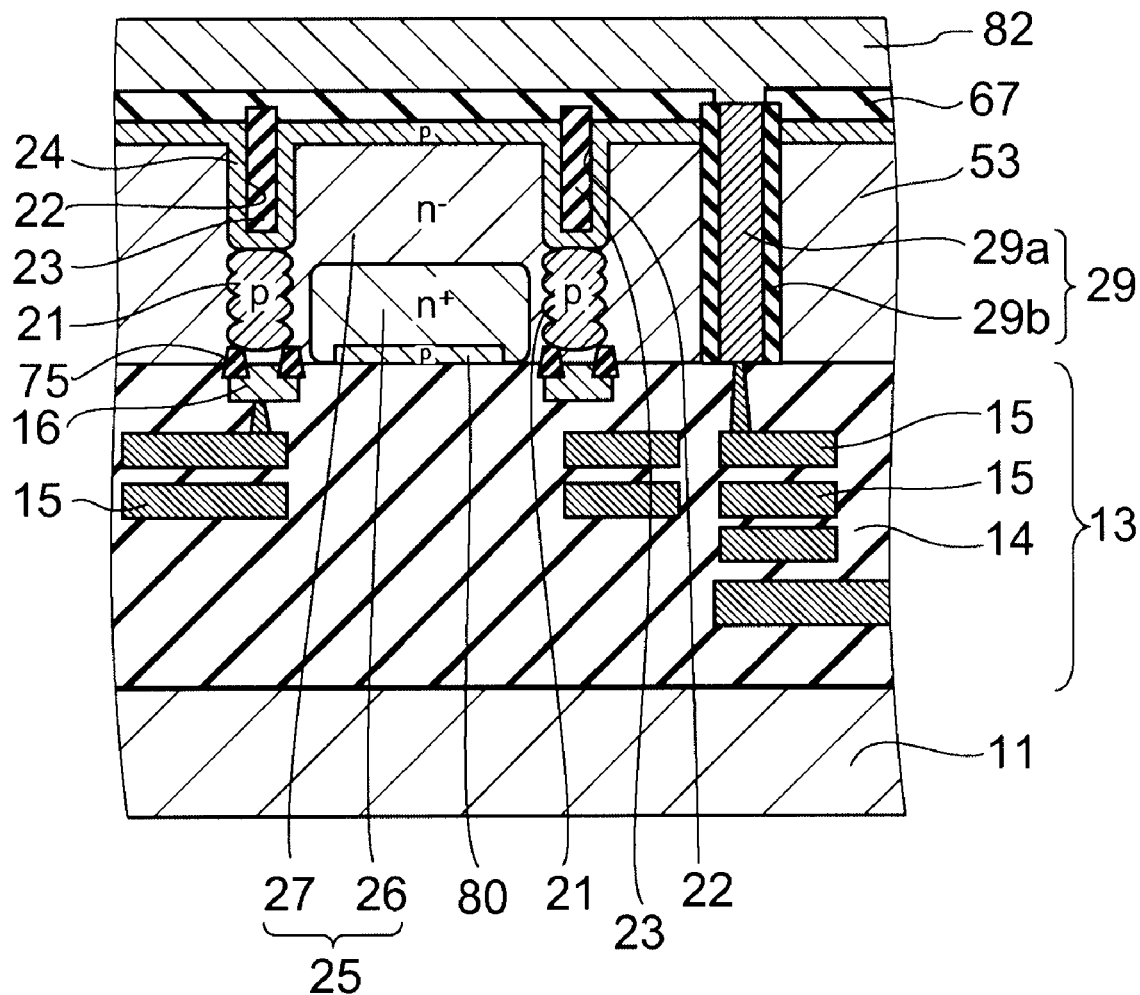

Next, as shown in FIG. 47, sputtering is performed on the silicon nitride film 67 to deposit titanium (Ti) to a thickness of 20 nm and deposit titanium nitride (TiN) to a thickness of 20 nm, thereby forming a barrier metal. Subsequently, by sputtering, an aluminum-copper alloy (AlCu) is deposited to a thickness of 0.3 μm. Thus, a metal film 82 made of a trilayer film, Ti-layer (20 nm)/TiN layer (20 nm)/AlCu layer (0.3 μm), is formed on the silicon nitride film 67. The metal film 82 is connected to the core 29a of the marker 29. If the core 29a is removed in the process shown in FIG. 46, the same material as the metal film 82 is buried inside the coating layer 29b of the marker 29.

Figure 48:
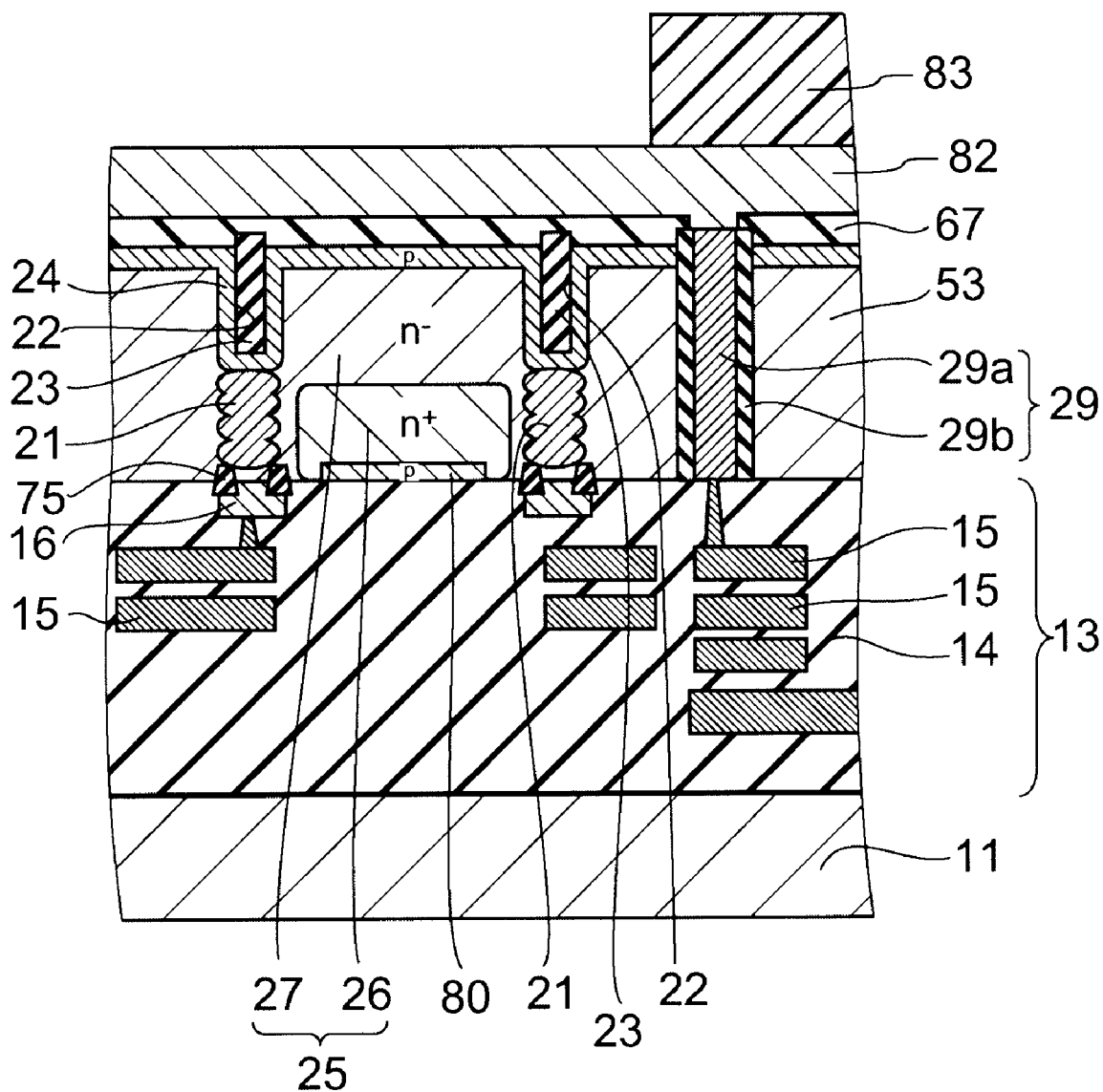

Next, as shown in FIG. 48, a resist material is applied onto the metal film 82 and patterned by lithography so as to cover a region including the immediately overlying region of the marker 29. Thus, a resist mask 83 having a thickness of e.g. 0.85 μm is formed.

Figure 49:
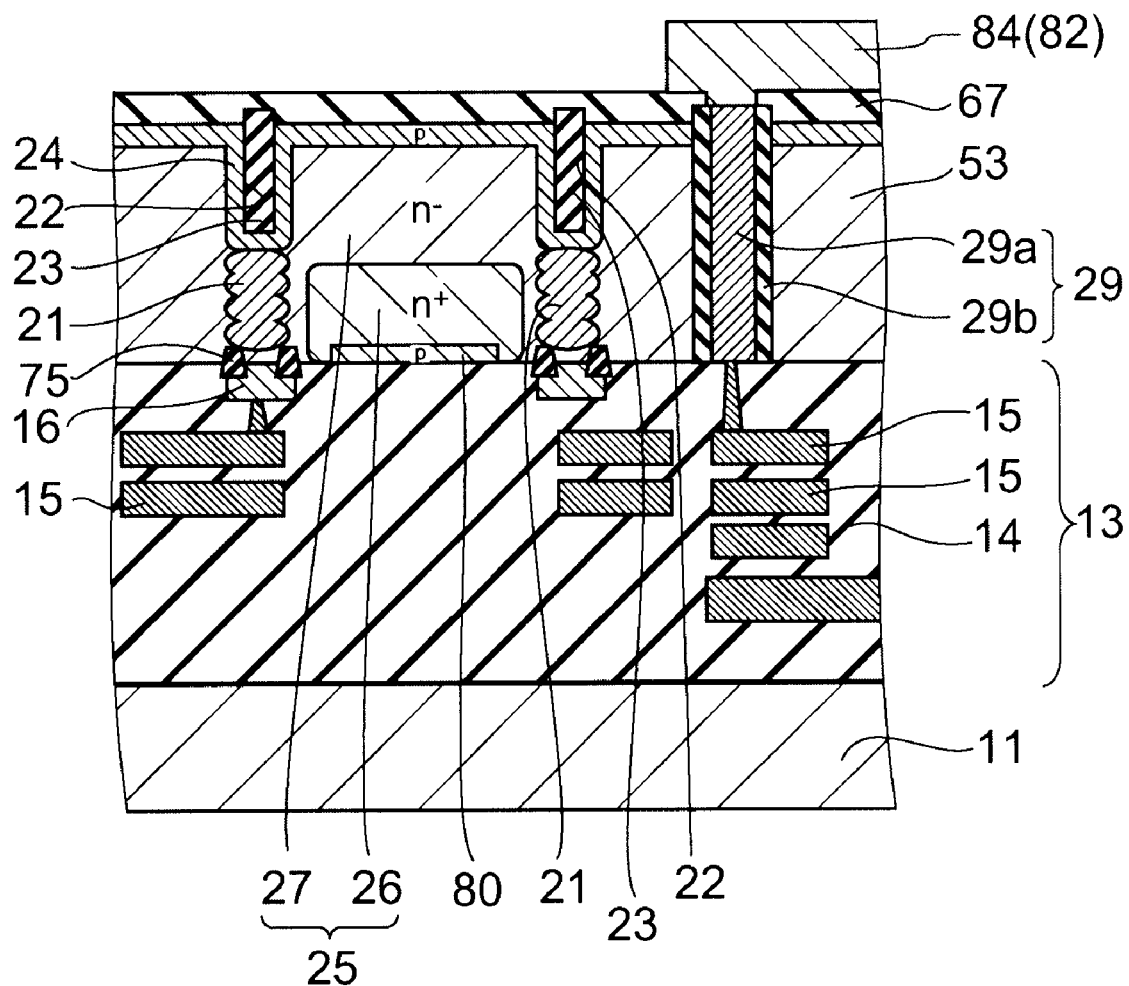

Next, as shown in FIG. 49, the resist mask 83 (see FIG. 48) is used as a mask to perform dry etching to selectively remove the metal film 82. Thus, the metal film 82 is left only in the region including the immediately overlying region of the marker 29 to form an interconnect 84. The interconnect 84 is connected to part of the metal interconnect 15 of the multilayer interconnect layer 13 through the core 29a of the marker 29. Subsequently, the resist mask 83 is removed.

Figure 50:
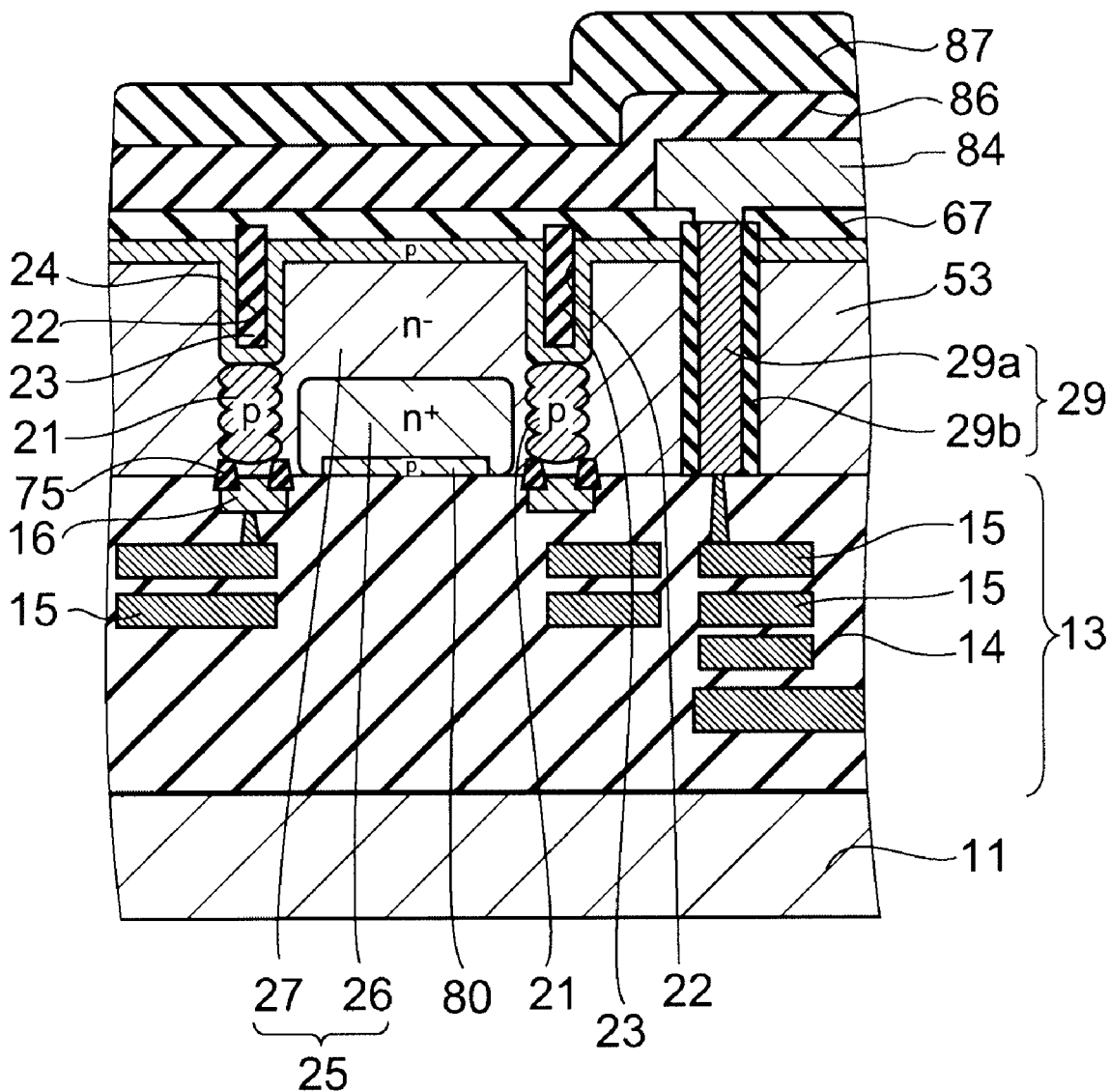

Next, as shown in FIG. 50, by the PECVD (plasma enhanced CVD) method using TEOS as a raw material, silicon oxide is deposited to a thickness of e.g. 300 nm to form a TEOS film 86. Subsequently, by the PECVD method, silicon nitride is deposited to a thickness of e.g. 600 nm to form a silicon nitride film 87. The TEOS film 86 and the silicon nitride film 87 constitute a passivation film.

Figure 51:
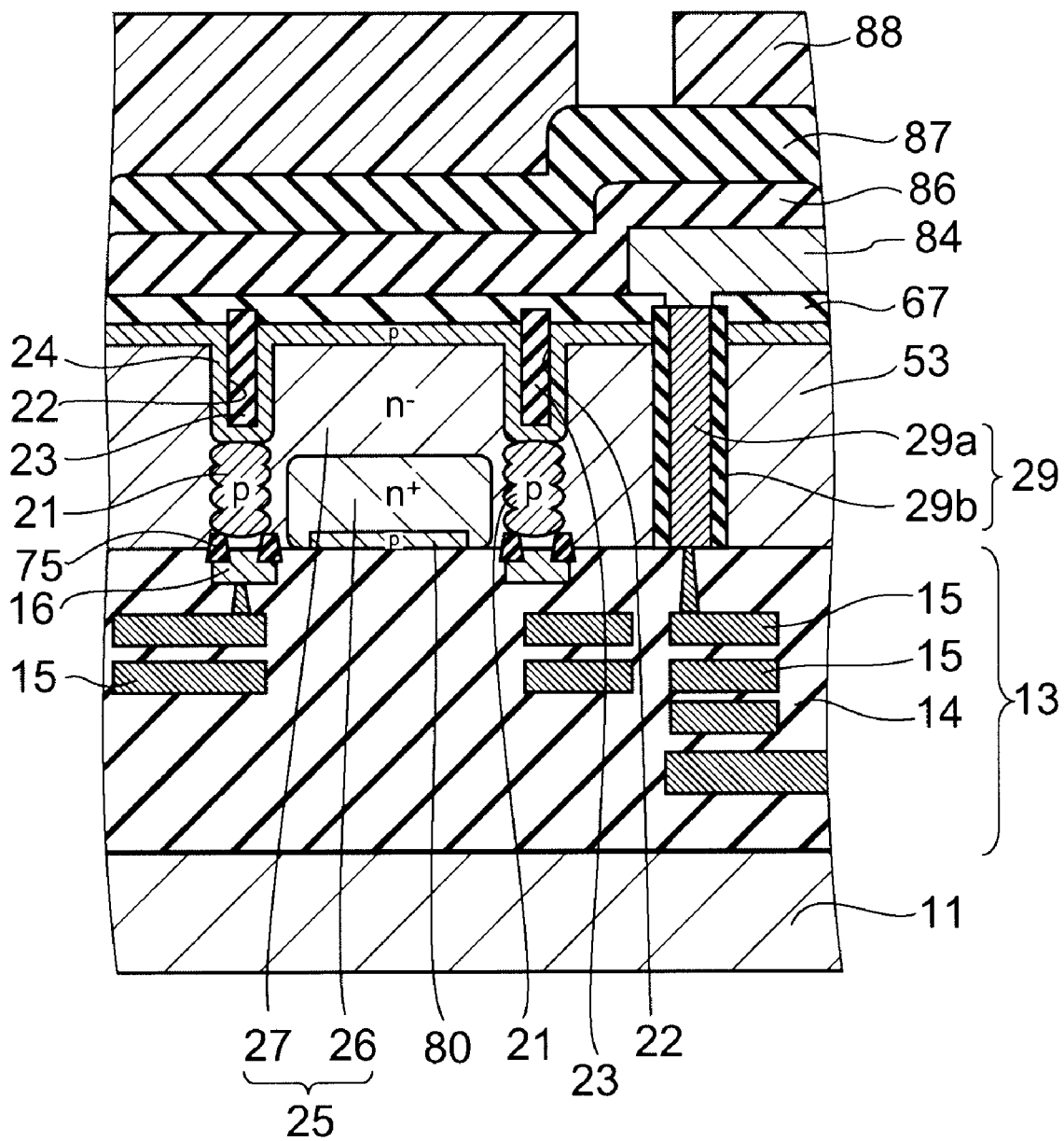

Next, as shown in FIG. 51, a resist film having a thickness of e.g. 1.3 μm is formed and processed into a prescribed pattern to form a resist mask 88.

Figure 52:
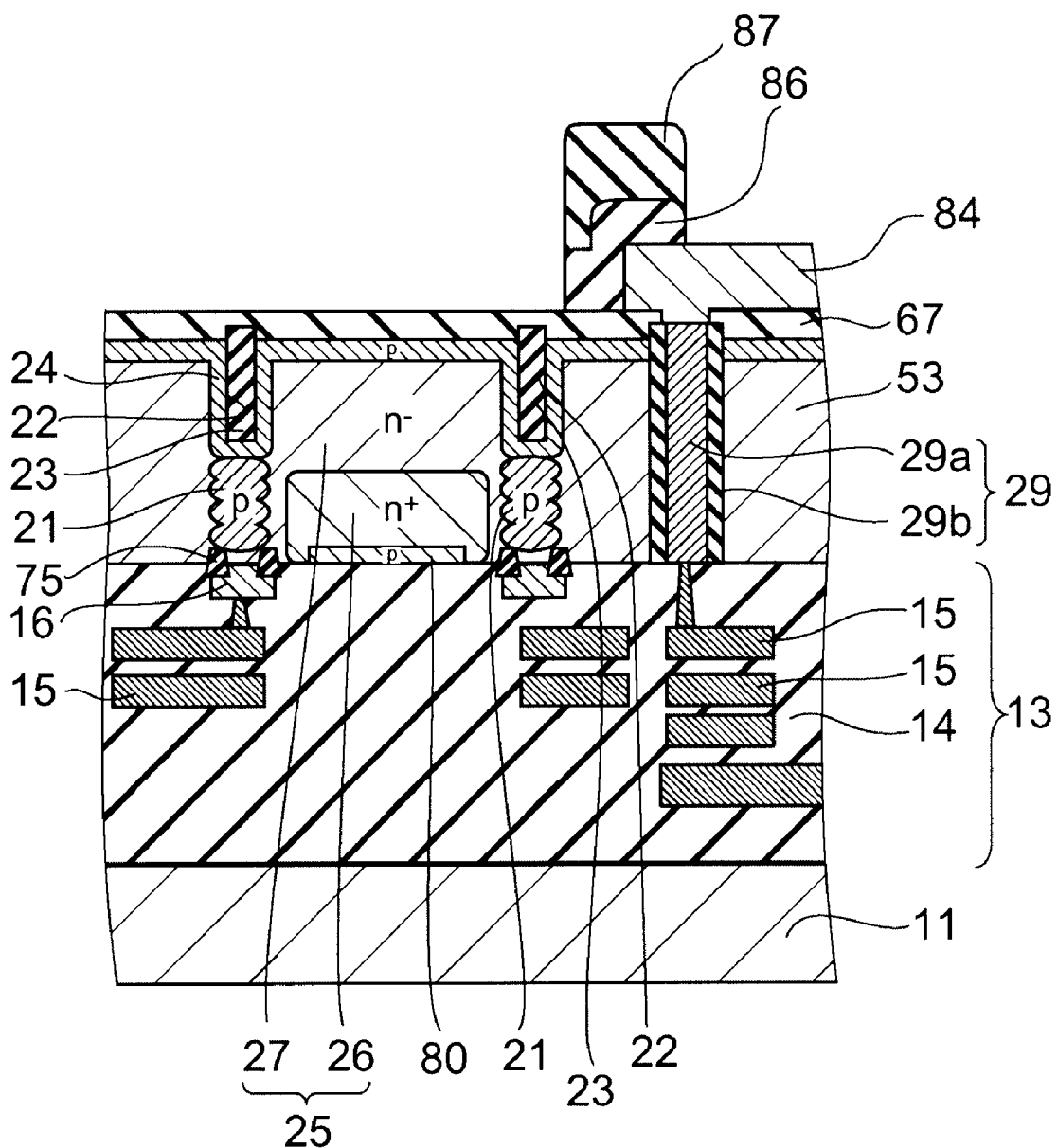

Next, as shown in FIG. 52, the resist mask 88 (see FIG. 51) is used as a mask to perform dry etching to selectively remove the passivation film. Next, sintering heat treatment is performed in an atmosphere of a forming gas, such as a mixed gas of nitrogen gas ($N_2$) and hydrogen gas ($H_2$).

Figure 53:
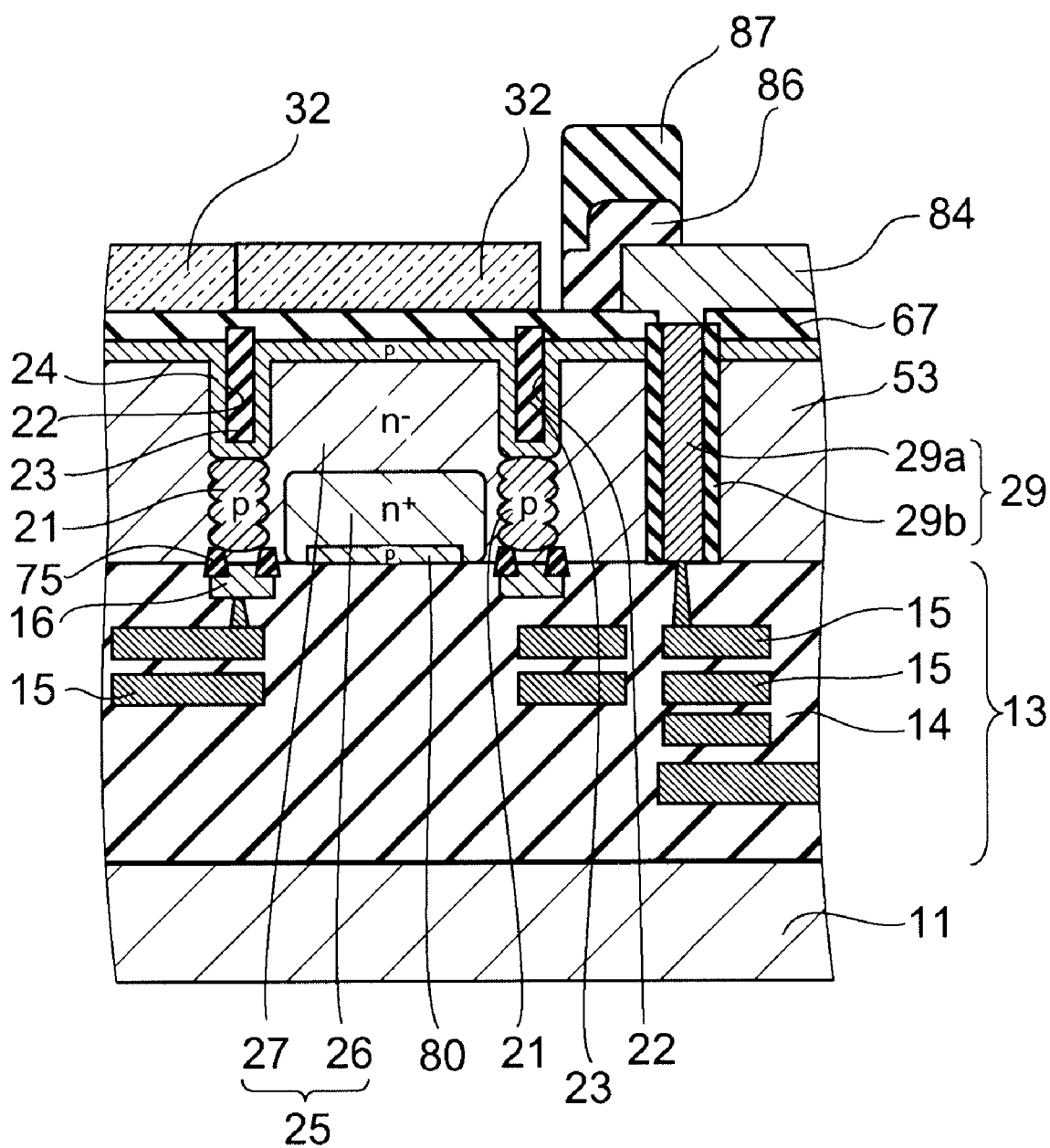

Next, as shown in FIG. 53, color filters 32 are formed on the silicon nitride film 67. The color filter 32 is formed immediately above each PD region 25 using the marker (not shown) for alignment so that the boundary between the color filters 32 is located immediately above the insulating member 23.

Figure 54:
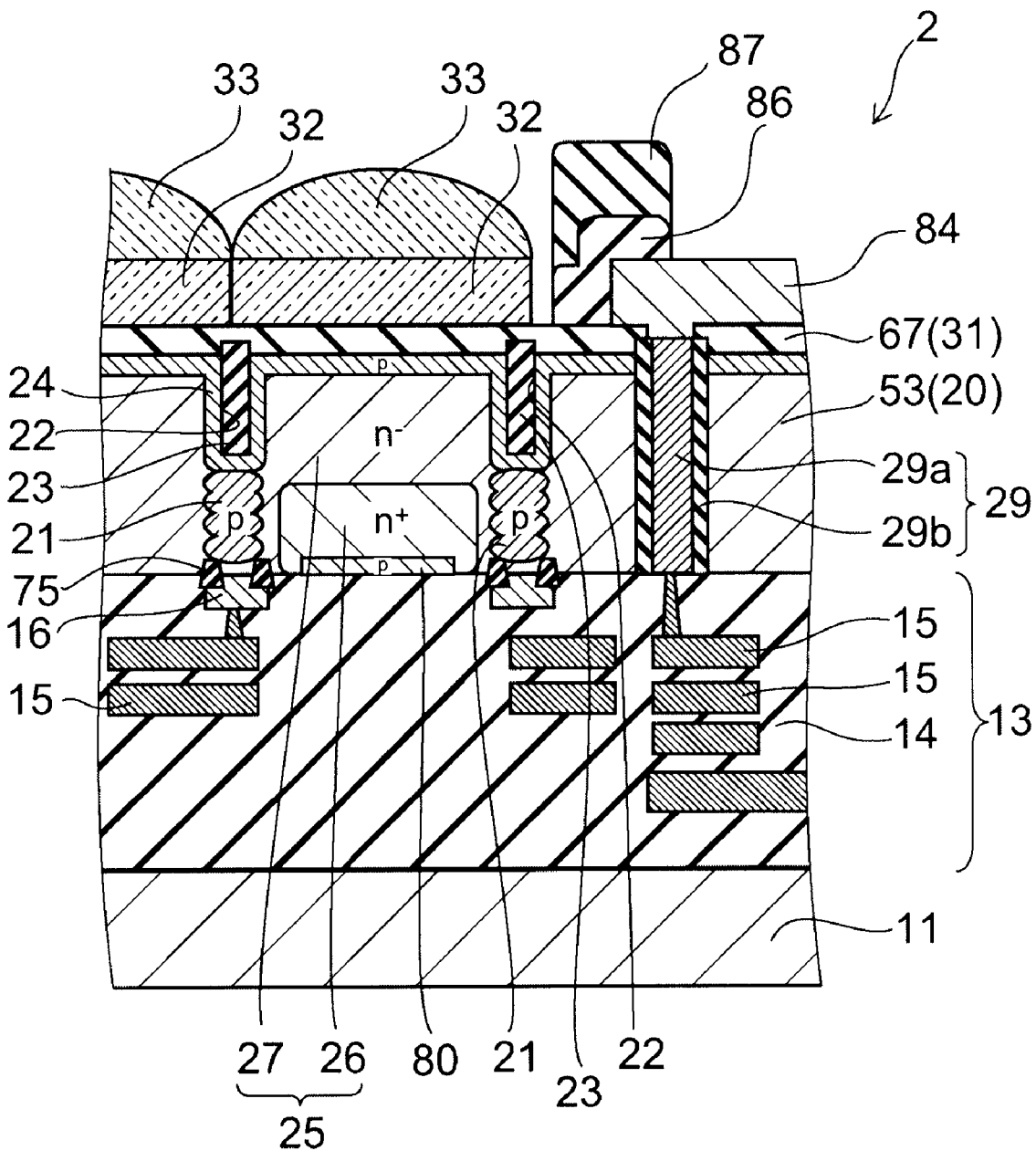

Next, as shown in FIG. 54, a microlens 33 is formed immediately above each color filter 32. Also at this time, the marker (not shown) is used for alignment.

By the foregoing process, the solid-state imaging device 2 according to this embodiment is manufactured. In the solid-state imaging device 2, the silicon layer 53 corresponds to the semiconductor substrate 20 of the above first embodiment, and the silicon nitride film 67 functions as the antireflective film 31. The configuration of the solid-state imaging device 2 other than the foregoing is the same as that of the solid-state imaging device 1 (see, e.g., FIG. 1) according to the above first embodiment.

As described above, this embodiment makes it possible to manufacture a solid-state imaging device in which an insulating member 23 is buried in the upper portion of the semiconductor substrate, a p-type region 21 is formed in the lower portion thereof, and a plurality of PD regions 25 are isolated from each other by the insulating member 23 and the p-type region 21.

In this embodiment, an SOI substrate 50 is illustratively used as a base substrate, but a conventional silicon wafer can also be used. In this case, in the process shown in FIGS. 32 and 33, instead of removing the base member 51 and the BOX oxide film 52, the thickness of the silicon wafer is reduced by grinding from its lower surface side. Furthermore, the aspect ratio of the trench 22 is preferably 10 or less, and more preferably 6 or less.

The invention has been described with reference to the embodiments. However, the invention is not limited to these embodiments. The above embodiments can be practiced in combination with each other. Furthermore, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A solid-state imaging device comprising:
an interconnect structure; and
a semiconductor substrate provided on the interconnect structure, the semiconductor substrate including:
   a first-conductivity-type region formed so as to partition a lower portion of the semiconductor substrate into a plurality of regions; and
   an insulating member made of an insulating material and buried in a region immediately above the first-conductivity-type region,
the semiconductor substrate being irradiated with light from its upper surface side;
   a high-concentration region of a second conductivity type formed in a lower portion of a region partitioned by the first-conductivity-type region and the insulating member; and
   a low-concentration region of the second conductivity type provided immediately above the high-concentration region and having a lower effective impurity concentration than the high-concentration region, and
the insulating member has a lower surface which is located above an interface between the high-concentration region and the low-concentration region.

2. The device according to claim 1, wherein a material constituting the insulating member has a lower transmittance to visible light than a material constituting the low-concentration region.

3. The device according to claim 1, wherein a material constituting the insulating member has a lower refractive index than a material constituting the low-concentration region.

4. The device according to claim 1, wherein the semiconductor substrate is formed from silicon, and the insulating member is formed from silicon oxide doped with at least one of boron and phosphorus.

5. The device according to claim 1, wherein the semiconductor substrate further includes another first-conductivity-type region enclosing the insulating member.

6. The device according to claim 1, wherein the insulating member is shaped like a lattice as viewed in a direction perpendicular to the upper surface of the semiconductor substrate.

7. The device according to claim 1, wherein in a direction perpendicular to the upper surface of the semiconductor substrate, the low-concentration region has a uniform impurity concentration profile, and the high-concentration region has an impurity concentration profile with a peak.

8. The device according to claim 1, further comprising:
a color filter placed above the semiconductor substrate for each of the partitioned regions; and
a microlens placed above the semiconductor substrate for each of the partitioned regions.

* * * * *